(12) United States Patent
Toyoda

(10) Patent No.: US 7,172,912 B2
(45) Date of Patent: Feb. 6, 2007

(54) PATTERN FORMING METHOD AND WIRING PATTERN FORMING METHOD, AND ELECTRO-OPTIC DEVICE AND ELECTRONIC EQUIPMENT

(75) Inventor: Naoyuki Toyoda, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 332 days.

(21) Appl. No.: 10/898,344

(22) Filed: Jul. 26, 2004

(65) Prior Publication Data

US 2005/0037275 A1    Feb. 17, 2005

(30) Foreign Application Priority Data

Aug. 12, 2003  (JP)  ............... 2003-292469

(51) Int. Cl.
*H01L 21/00* (2006.01)
*H01L 21/302* (2006.01)
*H01L 21/461* (2006.01)

(52) U.S. Cl. ................. 438/30; 438/48; 438/70; 438/708; 257/E21.347; 257/E21.596

(58) Field of Classification Search ............. 438/30, 438/48, 70, 708; 257/431, E21.347, E21.596
See application file for complete search history.

(56) References Cited

U.S. PATENT DOCUMENTS

2005/0042430 A1*  2/2005  Toyoda ............ 428/209

FOREIGN PATENT DOCUMENTS

| JP | A-62-276505 | 12/1987 |
| JP | A-05-074704 | 3/1993 |
| JP | 2000-282240 | 10/2000 |

* cited by examiner

*Primary Examiner*—William M. Brewster
(74) *Attorney, Agent, or Firm*—Oliff & Berridge, PLC

(57) ABSTRACT

To provide a pattern forming method enabling a thin film to be patterned with high precision by easy and low cost techniques. A thin film 2 is provided on a base material 1 containing a sublimable dyestuff, light is irradiated to the base material 1, and heat generated by the light irradiation sublimates the sublimable dyestuff in a desired region, thereby removing the thin film 2 corresponding to an irradiation region where the light is irradiated to thereby pattern this thin film 2.

29 Claims, 13 Drawing Sheets

LIGHT FLUX

PATTERN FORMING METHOD AND WIRING PATTERN FORMING METHOD, AND ELECTRO-OPTIC DEVICE AND ELECTRONIC EQUIPMENT

BACKGROUND OF THE INVENTION

1. Field of Invention

The present invention relates to a pattern forming method for forming a thin film pattern on a base material and a forming method of a wiring pattern using the thin film pattern, and an electro-optic device and electronic equipment.

2. Description of Related Art

Conventionally, as a manufacturing method of a device having a fine wiring pattern such as a semiconductor integrated circuit, a photolithography method is often used, however a device manufacturing method using a droplet discharging method (ink jet method) has attracted attention. There is proposed a method in which in the case where the fine wiring pattern is formed using the droplet discharging method, in order to increase precision in a pattern line width, a liquid repellent region and a lyophilic region are patterned on a base material in advance and a droplet is selectively arranged in the lyophilic region. In Patent Document 1 described below, a technique for patterning a monomolecular film provided on a substrate by a chemical vapor deposition method is disclosed.

[Patent Document 1]
  Japanese Unexamined Patent Publication No. 2000-282240

SUMMARY OF THE INVENTION

Meanwhile, the above-mentioned related art has a problem described below. The technique disclosed in the above-mentioned Patent Document 1 has a structure in which ultraviolet light or an electron beam of a short wavelength is irradiated to remove the monomolecular film from the substrate for patterning. This is because an absorption band of the monomolecular film to be patterned exists in the short wavelength, and with regard to infrared rays of a long wavelength which does not have the absorption band or the like, however high energy light is irradiated, the patterning is difficult. Therefore, the patterning of an organic thin film such as the monomolecular film has required an expensive large-scaled device such as ultraviolet irradiation and electron beam under vacuum.

The present invention has been achieved in view of such a situation, and an object of the present invention is to provide a pattern forming method enabling high precision patterning of a thin film by easy and low-cost techniques. Furthermore, it is another object to provide a wiring pattern forming method for forming a wiring pattern using the thin film, and to provide an electro-optic device and electronic equipment each having the wiring pattern.

In order to solve the above-mentioned problems, in a pattern forming method of the present invention, a thin film is provided on a base material containing a sublimable material, and light is irradiated to the base material, so that the sublimable material in a desired region is sublimated by heat generated by the light irradiation, and removing the thin film corresponding to an irradiation region where the light is irradiated to thereby pattern the thin film. Here, the sublimable material contains a sublimable dyestuff. The thin film includes an organic thin film, a monomolecular film, and a monomer containing a photoinitiator. According to the present invention, by providing the sublimable material on the base material or in the base material, the sublimable material in the desired region is heated by the irradiated light, the sublimation of the sublimable material allows the thin film in a desired region to be vaporized or decomposed, thereby patterning the thin film. Accordingly, even if a wavelength in which the thin film does not have an absorption band directly, it can be patterned by an absorption band having an absorption band of the sublimable material or the photothermal conversion material, and thus the thin film can be patterned at a high. That is, according to the present invention, a range of choice for a light irradiating device to be used is widened, and without using an expensive large-scaled light irradiating device, the thin film can be favorably removed from the base material to perform patterning with high precision.

Furthermore, in a pattern forming method of the present invention, a thin film is provided on a base material containing a gas generating material; and light is irradiated to the base material, so that a gas is generated from the gas generating material in a desired region by the light irradiation, thereby removing the thin film corresponding to an irradiation region where the light is irradiated to thereby pattern the thin film. According to the present invention, by providing the gas generating material on the base material or in the base material, the irradiated light can generate the gas from the desired region, and the gas generation can remove the thin film in the desired region from the base material to pattern the thin film. Accordingly, even if a wavelength in which the thin film does not have an absorption band directly, it can be patterned by an absorption band having the sublimable material or the photothermal conversion material, and thus the thin film can be patterned at convenient and high resolution. That is, according to the present invention, a range of choice for a light irradiating device to be used is widened, and without using an expensive large-scaled light irradiating device such as ultraviolet irradiation and electron beam under vacuum, the thin film can be favorably removed from the base material to perform patterning with high precision.

In the pattern forming method of the present invention, the sublimable material may be formed as a sublimable dyestuff layer independent of the base material and the thin film on a front surface side or a back surface side of the base material. Furthermore, there can be employed a structure that the sublimable dyestuff layer is provided on one surface side of the base material where the thin film is provided, or a structure that the sublimable dyestuff layer is provided adjacently to the thin film. Still furthermore, there can be employed a structure that the sublimable dyestuff layer is provided between the base material and the thin film, or a structure that the sublimable material is mixed in the base material. In any structure, the sublimable material is sublimated by light energy of the irradiated light, and this sublimation can vaporize or decompose the thin film in the desired region. Here, by providing the sublimable dyestuff layer and the thin film adjacently to each other, the sublimated region and the vaporized or decomposed region of the thin film can be matched with high precision, thereby enabling the patterning of the thin film at a higher resolution.

In the pattern forming method of the present invention, the base material preferably contains a photothermal conversion material converting light energy into thermal energy. Thereby, by irradiating the light in a desired region of the base material, the light energy of the light can be efficiently converted into the thermal energy by the photothermal conversion material, and the thermal energy can be supplied to the sublimable material in the desired region. Therefore, without using a high energy source such as electron beam and ultraviolet rays, the thermal energy enough to sublimate the sublimable material and to remove the thin film can be obtained easily and conveniently. Accordingly, according to the present invention, a range of choice for a light irradiating device to be used is widened, and without using an expensive large-scaled light irradiating device and a mask, the thin film can be more favorably removed from the base material to perform patterning with higher precision.

In the pattern forming method of the present invention, there can be employed a structure that the photothermal conversion layer containing the photothermal conversion material is provided independently of the base material, the thin film and the sublimable dyestuff layer, or a structure that the photothermal conversion material is mixed in the base material. In either structure, the light energy of the light can be converted into the thermal energy, and the thermal energy can be supplied to the sublimable dyestuff layer. Here, the photothermal conversion layer and the sublimable dyestuff layer are preferably provided adjacently to each other. Thereby, the heat generated part by the light irradiation can be brought into close contact with the sublimable dyestuff layer, and the thermal energy can be efficiently supplied to the sublimable dyestuff layer and the desired region of the sublimable dyestuff layer can be sublimated with high precision.

In the pattern forming method of the present invention, in the case of the structure where the photothermal conversion layer is provided independently, there can be employed a structure that the photothermal conversion layer is provided on the one surface side of the base material where the thin film is provided, or a structure that it is provided on another surface side of the base material where the thin film is not provided. Furthermore, there can be employed a structure that the photothermal conversion layer can be provided between the base material and the thin film. Accordingly, the pattern forming method of the present invention can be performed by a procedure in which the photothermal conversion layer is formed on at least one of the front surface and the back surface of the base material, the sublimable dyestuff layer is formed on an upper surface of the photothermal conversion layer, the thin film is formed on an upper surface of the sublimable dyestuff layer, and thereafter, the light is irradiated. Thereby, the light irradiation generates heat in a desired region of the photothermal conversion layer, the heat is supplied to a desired region of the sublimable dyestuff layer, the desired region of the sublimable dyestuff layer is sublimated, and the sublimation removes a desired region of the thin film to pattern the thin film. Here, since the thin film is in an opening state (exposed state) with respect to the outside, the thin film removed by the sublimation can be smoothly emitted to the outside.

In the pattern forming method of the present invention, there can be employed a technique in which the light is irradiated from the one surface side of the base material where the thin film is provided, or a technique in which the light is irradiated from the another surface side of the base material where the thin film is not provided. In the case where the light is irradiated from the one surface side, since the light can be irradiated to the sublimable dyestuff layer or the photothermal conversion layer or the like without passing through the base material, for example, deviation in the light irradiation position or the like due to diffraction or scattering of the light caused by passing through the base material is prevented from occurring, and the light can be irradiated in a desired position to pattern the thin film in a desired pattern with high precision. Furthermore, in the case where the light is irradiated from the another surface side, the sublimable dyestuff layer (and the photothermal conversion layer) is provided between the base material and the thin film, so that the light can be irradiated directly to the sublimable dyestuff layer (and the photothermal conversion layer) passing through the base material without passing through the thin film, and thus the light energy can be efficiently converted into thermal energy and the thermal energy can be supplied to the sublimable dyestuff layer.

In the pattern forming method of the present invention, based on a light transmittance of at least one of the thin film, the sublimable dyestuff layer, the photothermal conversion layer, and the base material, it may be determined whether the light is irradiated from the one surface side or from the another surface side. For example, in the case where the light transmittance of the base material is extremely low, the light may be irradiated from the one surface side (the front surface side of the base material), and in the case where the light transmittance of the base material is high and the light transmittance of the thin film is low, the light may be irradiated from the another surface side (the back surface side of the base material). In other words, for example, when the irradiated light has such a wavelength that the thin film material absorbs the light, and when the sublimable dyestuff layer and the photothermal conversion layer are structured so as to be provided on the lower layer side of the thin film, by directly irradiating the light to the thin film from the upper layer side of the thin film, an inconvenience may arise that the light is absorbed in the thin film and does not reach to the photothermal conversion layer on the lower layer side. Therefore, in such a case, it may be determined that the light is irradiated from the lower layer side of the thin film (the back surface side of the base material).

In the pattern forming method of the present invention, the photothermal conversion material may be mixed in the sublimable dyestuff layer. Thereby, when the sublimable material is sublimated, the photothermal conversion material is sublimated together, and thus the photothermal conversion material can also be removed from the base material.

In the pattern forming method of the present invention, there can be employed a structure that between the base material or the photothermal conversion layer and the sublimable dyestuff layer, the gas generating layer containing the gas generating material that generates the gas by light irradiation or heating is provided. Thereby, only by light irradiation, only by heating, or by both the light irradiation and the heating, the gas can be generated to pattern the thin film.

In the pattern forming method of the present invention, it is preferable that the light is laser light and has a wavelength according to at least one of the sublimable material and the photothermal conversion material. Thereby, light energy of the light irradiated to the sublimable material or the photothermal conversion material can be efficiently converted into thermal energy. In particular, the use of infrared laser light as the light allows a comparatively low cost device structure to be attained. Furthermore, the light irradiation is preferably performed in such a manner that the light focuses on the sublimable dyestuff layer or the photothermal conversion layer. Thereby, the light energy can be supplied to a desired region of the sublimable dyestuff layer or the photothermal conversion layer with high precision and at a high resolution, thereby forming the thin film pattern at a high resolution conveniently.

In a wiring pattern forming method of the present invention, a wiring pattern is formed on the base material having the thin film pattern formed by the above-mentioned pattern forming method. Furthermore, the wiring pattern forming method of the present invention comprises a step of arranging a droplet containing a wiring pattern forming material on the base material where the thin film pattern is formed. According to the present invention, based on a droplet discharging method, the fine wiring pattern can be favorably formed at a high resolution while suppressing the loss of consumed materials.

An electro-optic device of the present invention has the wiring pattern formed by the above-mentioned wiring pattern forming method. Furthermore, electronic equipment of the present invention has the above-mentioned electro-optic device. According to the present invention, there can be provided the electro-optic device having the fine wiring pattern formed based on the droplet discharging method and capable of exerting a desired performance and the electric device having the same. As the electro-optic device, a liquid crystal display device, an organic EL (electro luminescence) display device, a plasma display device or the like can be exemplified.

Furthermore, using the thin film pattern formed by the pattern forming method according to the present invention, respective components of a color filter, a liquid crystal display device, an organic EL display device, a plasma display device, a microlens, a DNA chip or the like can be formed.

The above-mentioned droplet discharging method is realized using a droplet discharging device comprising a discharging head, and the droplet discharging device includes an ink jet device comprising an ink jet head. The ink jet head of the ink jet device can discharge a droplet of a liquid material containing a functional liquid quantitatively by an ink jet method, and for example, it is a device capable of dropping the liquid material of 1 through 300 nanograms per dot quantitatively and intermittently. As the droplet discharging device, a dispenser device may be used.

The liquid material denotes a medium having a viscosity capable of discharging (capable of dropping) the material from a discharging nozzle of the discharging head of the droplet discharging device. It does not matter whether it is water-based or oil-based. It is sufficient as long as the material has fluidity (viscosity) capable of discharging itself from the discharging nozzle or the like, and even if any solid substance is mixed, it is sufficient as long as it is a fluid as a whole. Furthermore, the material contained in the liquid material may be one heated to higher than a melting point and fused, may be one stirred in a solvent as fine particles, or may be one obtained by adding a dye, a pigment or other functional materials thereto, in addition to the solvent.

Furthermore, the above-mentioned functional liquid is the liquid material containing a functional material, and exerts a predetermined function by arranging it on the base material. As the functional material, there are exemplified a liquid crystal display device forming material for forming the liquid crystal display device including a color filter, an organic EL display device forming material for forming the organic EL (electro luminescence) display device, a plasma display device forming material for forming the plasma display device, a wiring pattern forming material containing a metal for forming the wiring pattern in which electric power flows, or the like.

DETAILED DESCRIPTION OF PREFERRED EMBODIMENTS

<Thin Film Pattern Forming Method>

Figure 1:
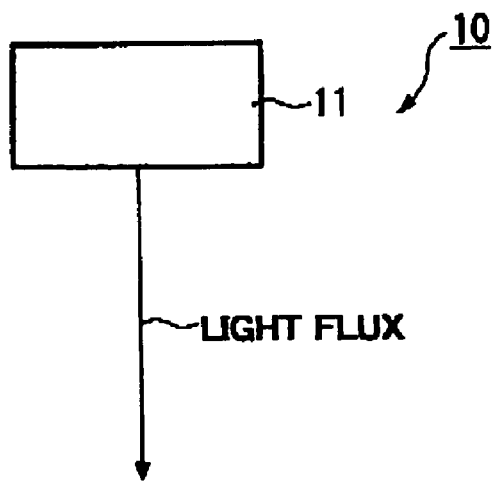
FIG. 1 is a schematic structural view showing one embodiment of a pattern forming device for use in a pattern forming method of the present invention.
Figure 1:
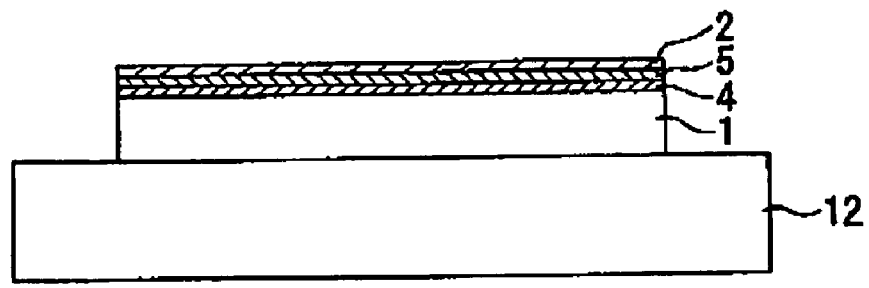
Figure 1:
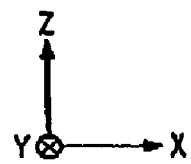

Hereinafter, a description of a pattern forming method of the present invention is given referring to the drawings. FIG. 1 is a schematic structural view showing one embodiment of a pattern forming device used for the thin film pattern forming method of the present invention. In FIG. 1, a pattern forming device 10 comprises a laser light source 11 emitting laser light flux having a predetermined wavelength, and a stage 12 supporting a base material 1 to be processed. On an upper surface of the base material 1, a photothermal conversion layer 4 is provided, on the photothermal conversion layer 4, a sublimable dyestuff layer 5 is provided, and on the sublimable dyestuff layer 5, a thin film 2 is provided. In this structure (the respective layers on the upper surface side) of the base material 1, it is also possible that the photothermal conversion layer 4 is omitted to provide the sublimable dyestuff 5 on the upper surface of the base material 1, and to provide the thin film 2 on the upper surface of the sublimable dyestuff layer 5. In the present embodiment, a near infrared semiconductor laser (with wavelength of 830 nm) is used as the laser light source 11.

Here, in the description below, a predetermined direction in a horizontal surface is defined as an X axial direction, a direction perpendicular to the X axial direction in the horizontal surface is defined as a Y axial direction, and a direction perpendicular to the X axis and the Y axis, respectively (vertical direction) is defined as a Z axial direction.

The stage 12 is provided movably in the X axial direction and the Y axial direction in a state of supporting the base material 1, and the base material 1 is movable with respect to light flux emitted from the light source 11 by movement of the stage 12. Furthermore, the stage 12 is also movable in the Z axial direction. Here, between the light source 11 and the base material 1 supported by the stage 12, an optical system not shown in the figure is arranged. The stage 12 supporting the base material 1 can move in the Z axial direction, thereby adjusting a position of the base material 1 with the respect to a focal point of the optical system. The light flux emitted from the light source 11 irradiates the base material 1 (the photothermal conversion layer 4) supported by the stage 12. The focal point of the optical system is preferably located in the photothermal conversion layer 4. In the case where the photothermal conversion layer 4 is omitted as described above, the focal point of the optical system is preferably located in the sublimable dyestuff layer 5.

Herein, the base material 1 is supported by the stage 12 moving translationally in the X and Y directions, while in the case where the base material 1 is held by a rotating drum, for example, a scanning direction of the light source 11 is defined as an X axial direction, and a rotative direction of the rotating drum is defined as a Y axial direction.

As the base material 1, a glass substrate, a transparent polymer or the like, for example, can be used. As a transparent polymer, polyester such as polyethylene terephthalate, polyacryl, polyepoxy, polyethylene, polystyrene, polycabonate, polysulfone or the like are exemplified. In the case where the base material 1 is formed of the transparent polymer, a thickness thereof is preferably 10 through 500 µm. Thereby, for example, the base material 1 can be formed into a band shape to be wound into a roll, and can be carried (moved) while being held by the rotating drum or the like.

The photothermal conversion layer 4 is provided independently of the base material 1, the sublimable dyestuff layer 5 and the thin film 2, and in the present embodiment, it is provided on a front surface side of the base material 1 where the thin surface 2 is provided, concretely, between the base material 1 and the sublimable dyestuff layer 5. The photothermal conversion layer 4 is a layer containing a photothermal conversion material converting light energy into thermal energy. For the photothermal conversion material composing the photothermal conversion layer 4, a publicly known one can be used, and is not particularly limited as long as it is a material capable of efficiently converting laser light into heat. For example, there are exemplified such as a metal layer composed of aluminum or an oxide and/or sulfide of the same, an organic layer composed of a polymer with carbon black, graphite or an infrared ray absorbing dyestuff or the like added or the like. As the infrared ray absorbing dyestuff, there are exemplified such as anthraquinone based, dithiol-nickel complex based, cyanine based, azo cobalt complex based, diimmonium based, squalelium based, phthalocyanine based, naphthalocyanine based ones. Furthermore, a synthetic resin such as an epoxy resin may be used as a binder, and in the binder resin, the phtothermal conversion material may be dissolved or dispersed to be provided on the base material 1. As a matter of course, without dissolving or dispersing in the binder, the photothermal conversion material can be provided on the base material 1.

In the case where the metal layer is used as the photothermal conversion layer 4, it can be formed on the base material 1 by a vacuum deposition method, an electron beam vapor deposition method, or sputtering. In the case where the organic layer is used as the photothermal conversion layer 4, a general film coating method, for example, such as an extrusion coating method, a spin coating method, a gravure coating method, a reverse roll coating method, a rod coating method, a micro gravure coating method, a knife coating method or the like are used to form it on the base material 1.

The sublimable dyestuff layer 5 is provided independently of the base material 1, the photothermal conversion layer 4 and the thin film 2. In the present embodiment, the sublimable dyestuff layer 5 is provided on the front surface side of the base material 1 where the thin surface 2 is provided, concretely, between the photothermal conversion layer 4 and the thin film 2. The sublimable dyestuff composing the sublimable dyestuff layer 5 has a property that it is sublimated by heat to thereby vaporize and emit the dyestuff. A sublimation transfer method using this property has conventionally been used as an image printing device or the like. Furthermore, the sublimable dyestuff has recently attracted attention as a printing method most suitable for an image forming method from a digital camera. A basic technique of the recording method using this sublimable dyestuff is a sublimation printing (a method of vaporizing a dyestuff at high temperature to dye) which is one of fiber dyeing methods. Using a color material referred to as a disperse dye used for the sublimation printing as a clue, the sublimable dyestuff improved in hue, sensibility (sublimability), solubility with respect to a binder resin or the like is used.

Next, in regard to the sublimable dyestuff composing the sublimable dyestuff layer 5, examples of three primary colors for sublimation recording are given. As yellow (Y), piridone azo based, dicyanostyryl based, or quinophthalone based material is used. As magenda (M), an anthraquinone based, tricyanostyryl based, or benzenazo based material is used. As cyan (C), an anthraquinone based, indophenole based, or indonaphtol based material is used.

When a desired region of the sublimable dyestuff layer 5 is heated to be sublimated, a part of the thin film 2 corresponding to a desired region can be physically vaporized or decomposed together with the sublimation.

As a material in which on the upper surface of the base material 1, the photothermal conversion layer 4 is provided and on the upper layer of the photothermal conversion layer 4, the sublimable dyestuff layer 5 is provided, for example, a laser thermal-transfer printer film (made by Imation Corp.) is exemplified. This laser thermal-transfer printer film is understood to have a structure in which the photothermal conversion layer is included in polyethylene terephthalate (PET), and thereon, the sublimable dyestuff is applied. This laser thermal-transfer printer film is preferably subjected to atmospheric pressure plasma treatment at 10 [mm/s] to modify a surface thereof.

The thin film 2 is composed of an organic thin film, and can be formed on the sublimable dyestuff layer 5 (the base material 1), for example, by a chemical vapor deposition method, a dipping method, a vapor deposition method, a spin casting method, a chemical adsorption method, a self assembled film forming method or the like. In the present embodiment, the thin film 2 (organic thin film) is formed of a monomolecular film composed of fluoroalkylsilane (FAS). Furthermore, as a material forming the monomolecular film, for example, heptadecafluoro-1,1,2,2, -tetrahydrodecyl trimethoxysilane (FAS-17) or octadecylamine used for interfacial active agent, or the like is exemplified.

As a forming method of the thin film 2, a general film coating method, for example, an extrusion coating method, a spin coating method, a gravure coating method, a reverse roll coating method, a rod coating method, a micro gravure coating method, or the like can be used to form the thin film 2 on the sublimable dyestuff layer 5 (the base material 1). In this case, in the coating methods of the thin film 2, it is preferable to neutralize static electricity charged in the front surface of the base material 1 and to uniformly form a thin film forming functional liquid on the base material 1, and thus in a device used for each of the methods, a neutralization device is preferably mounted.

Next, one example of a method for forming the thin film 2 in the above-mentioned laser thermal-transfer printer film (film in which the photothermal conversion layer 4 is provided on the upper surface of the base material 1 and on the upper layer of the photothermal conversion layer 4, the sublimable dyestuff layer 5 is provided) is described. Firstly, a container containing FAS-17 and the above-mentioned laser thermal-transfer printer film modified in surface are put into a container made of Teflon (registered trademark). Subsequently, the entire container made of Teflon (registered trademark) is placed in an electric furnace, and a temperature in the electric furnace is increased to 80° C. to hold the container therein for two hours. Then, the container made of Teflon (registered trademark) is taken out from the electric furnace and is left for one night. Thereby, the vaporized FAS-17 is chemical-vapor-deposited on the laser thermal-transfer printer film to form an organic thin film (the thin film 2).

For example, with respect to the thin film 2 formed on the laser thermal-transfer printer film as described above, a near infrared semiconductor laser (with an output of 11W) having a wavelength of 830 nm is irradiated to an arbitrary position at a drum rotational speed of 130 rpm by a CTR plate setter. Thereby, the color of the sublimable dyestuff disappears, and rendering the color of the laser thermal-transfer printer film itself to be visible, so that it is confirmed that the sublimable dyestuff (the sublimable dyestuff layer 5) is removed. Furthermore, a contact angle with respect to water (lyophilic/liquid repellent) on a front surface of the laser thermal-transfer printer film after the irradiation of the near infrared semiconductor laser changes from 109 to 72 degrees, so that it is confirmed that the thin film 2 is also removed together with the removal of the sublimable dyestuff layer 5.

Figure 2A:
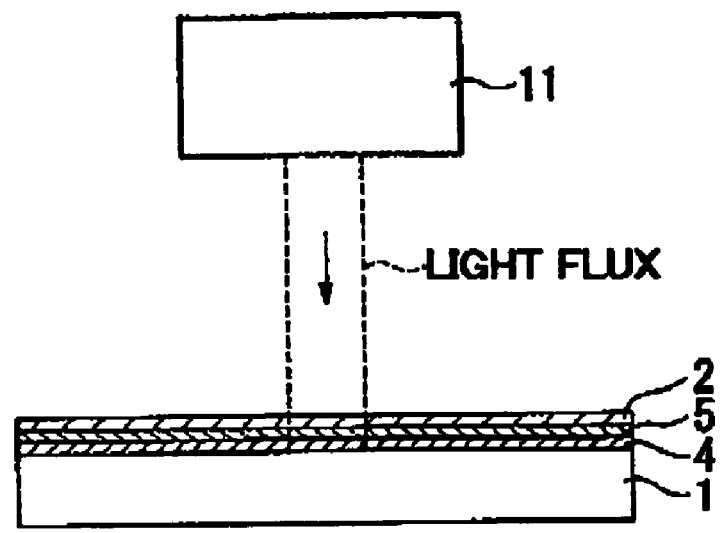
FIG. 2 is schematic view showing one embodiment of the pattern forming method of the present invention.
Figure 2B:
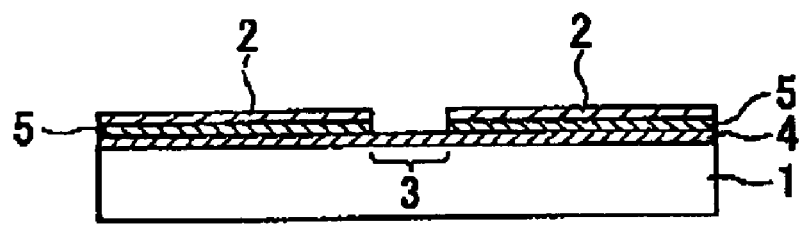

Next, referring to FIG. 2, a procedure for forming a pattern is described. As shown in FIG. 2(a), laser light flux having a predetermined light flux diameter is irradiated from the upper surface (front surface) side of the base material 1 where the thin film 2 is provided. By irradiating the laser light flux, the base material 1 and the photothermal conversion layer 4 on the base material 1 corresponding to the irradiation position are heated. The photothermal conversion layer 4 absorbs the irradiated laser light flux and light energy thereof is converted into thermal energy. The thermal energy generated in the photothermal conversion layer 4 sublimates a part of the sublimable dyestuff layer 5 adjacent to the photothermal conversion layer 4, and a part of the thin film 2 is vaporized or decomposed by the sublimation to be selectively removed from the base material 1. Thereby, as shown in FIG. 2(a), the part of the thin film 2 and the part of the sublimable dyestuff layer 5 corresponding to the irradiation region (the irradiation position) where the light is irradiated are removed from the base material 1 to pattern the thin film 2.

The light irradiation allows the photothermal conversion layer 4 (the base material 1 in an embodiment in FIG. 4 described later) to be exposed in a removal region 3 where the thin film 2 and the sublimable dyestuff layer 5 are removed. Here, before the thin film 2 and the sublimable dyestuff layer 5 are formed on the photothermal conversion layer 4 (the base material 1), the photothermal conversion layer 4 (the base material 1) has been subjected to lyophilic treatment, which allows the photothermal conversion layer 4 (the base material 1) having lyophilic to be exposed by the light irradiation. As the lyophilic treatment, an ultraviolet ray (UV) irradiation treatment, an O2 plasma treatment or the like are exemplified. Since the thin film (monomolecular film) 2 composed of FAS (or FAS-17) has liquid repellent, patterning of the thin film 2 allows a liquid repellent region and a lyophilic region to be formed on the base material 1.

At this time, by moving the stage 12 along the XY plain surface with respect to the irradiated laser light flux, the removal region 3 according to a movement trajectory of the stage 12 is plotted. In this manner, a thin film pattern is formed on the base material 1.

As described above, the photothermal conversion layer 4 containing the photothermal conversion material is provided on the base material 1 and on the photothermal conversion layer 4, the sublimable dyestuff layer 5 is provided, so that the light energy of the irradiated light can be efficiently converted into thermal energy, the thermal energy can be supplied to the sublimable dyestuff layer 5, the thin film 2 in the removal region 3 can be vaporized or decomposed by the sublimation of the sublimable dyestuff layer 5, and the thin film 2 can be patterned. Therefore, unlike the related art, without irradiating light with a wavelength of an absorption band that the thin film itself has, patterning can be performed. In addition, the required energy is not energy for removing the thin film 2, but the patterning can be performed with energy required for sublimation of the sublimable dyestuff layer 5. Accordingly, a range of choice for a light irradiating device to be used is widened, and without using an expensive large-scaled light irradiating device, the thin film 2 can be favorably removed from the base material 1 at a high resolution to perform patterning.

The thin film 2 may be formed of a monomer containing a photoinitator. The monomer can be removed from the base material 1 by irradiation of laser light flux. Accordingly, a coating liquid (the functional liquid) containing a photoinitiator and a monomer is applied on the base material 1, and the thin film pattern is formed by the laser light irradiation, and thereafter, polymerization (photo curing) by light irradiation according to the photoinitiator is performed to thereby form the patterned thin film 2. The coating liquid containing the photoinitiator and the monomer can be applied on the sublimable dyestuff layer 5 (the base material 1) by such a general film coating method as described above (a spin coating method, a gravure coating method, a reverse roll coating method, a rod coating method, a micro gravure coating method).

It is preferable that the compound forming the thin film 2 (organic thin film) partially has a functional group generating a chemical interaction with the base material 1 (the sublimable dyestuff layer 5). As the functional group, an aldehyde group, a ketonic group, an amide group, an imide group or the like are exemplified. Alternatively, a silicon group having an alkoxy group, a halogen group, an alkyl group, an amino group or the like may be used. Furthermore, an ionic group such as an ammonium group and a pyridinium group may be used.

In the present embodiment, although by moving the stage 12 supporting the base material 1, the removal region 3 is plotted on the base material 1, as a matter of course, the irradiated light flux may be moved in a state of stopping the base material 1, or both the base material 1 and the light flux may be moved. Furthermore, in the case where the base material 1 is moved, in addition to the structure in which the base material 1 is moved in the XY plain surface by the stage 12, the structure in which the base material 1 is moved in a state of being held by the rotating drum as described above can be employed.

Figure 3A:
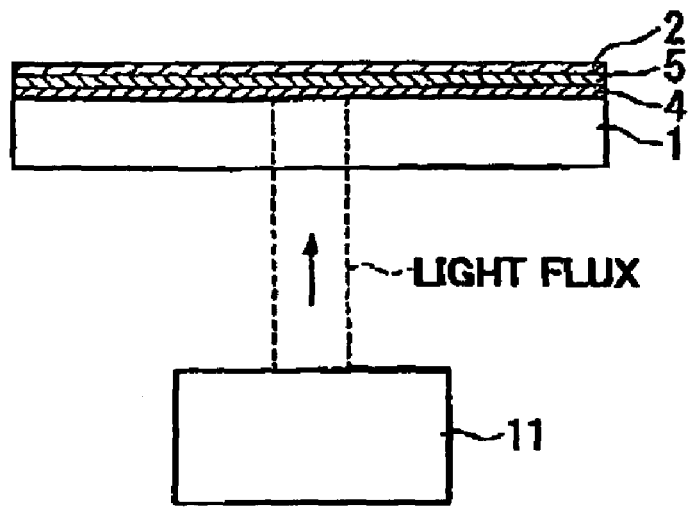
FIG. 3 is schematic view showing another embodiment of the pattern forming method of the present invention.
Figure 3B:
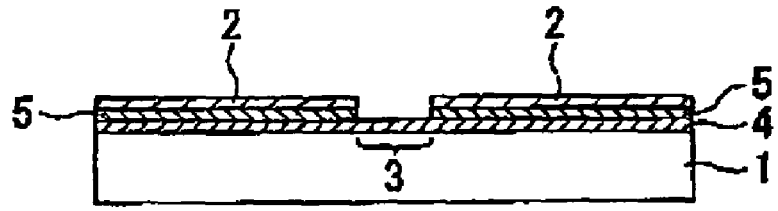

As shown in FIG. 3, in the case where the photothermal conversion layer 4 and the sublimable dyestuff layer 5 are provided between the base material 1 and the thin film 2, the light flux may be irradiated to the base material 1 from a back surface side of the base material 1 where the thin film 2 is not provided. In this case, the base material 1 is formed of a transparent material through which the light flux can transmit. Thereby, the light is directly irradiated to the photothermal conversion layer 4 through the base material 1 and the photothermal conversion layer 4 smoothly converts the light energy of the irradiated light into thermal energy and removes a part of the sublimable dyestuff layer 5 and a part of the thin film 2 corresponding to the irradiation region (irradiation position) of the adjacent sublimable dyestuff layer 5, thereby enabling the pattern to be formed. Furthermore, the photothermal conversion layer 4 and the sublimable dyestuff layer 5 are provided between the base material 1 and the thin film 2, and the thin film 2 is kept in an opening state (exposed state) to the outside, thereby smoothly emitting the part of the thin film 2 corresponding to the light irradiation region to the outside.

In the case of the structure that the light is irradiated to the photothermal conversion layer 4 through the base material 1 from the back surface side of the base material 1, since there is a possibility that the light is scattered (diffracted) when passing through the base material 1, it is preferable that the scattering state is measured in advance, and that in order to irradiate the light at a desired position of the photothermal conversion layer 4, the light is irradiated from the back surface side of the base material 1 while adjusting irradiation conditions based on the measurement result. Furthermore, the light may be irradiated from both of the front surface side and the back surface side of the base material 1.

Furthermore, according to properties of the thin film 2, the sublimable dyestuff layer 5, the photothermal conversion layer 4 or the base material 1 (material properties such as a light transmittance, for example), it may be determined whether the light is irradiated from the front surface side or the back surface side of the base material 1. For example, in regard to the wavelength of the irradiated light, in the case where the thin film 2 is made of a material absorbing the light of the wavelength, when the light is irradiated from the front surface side as shown in FIG. 2, there may arise an inconvenience that the light is absorbed in the thin film 2 and does not reach the photothermal conversion layer 4 (or the sublimable dyestuff layer 5) on the lower layer side. In such a case, it may be determined that the light is irradiated from the back surface side of the base material 1.

Figure 4A:
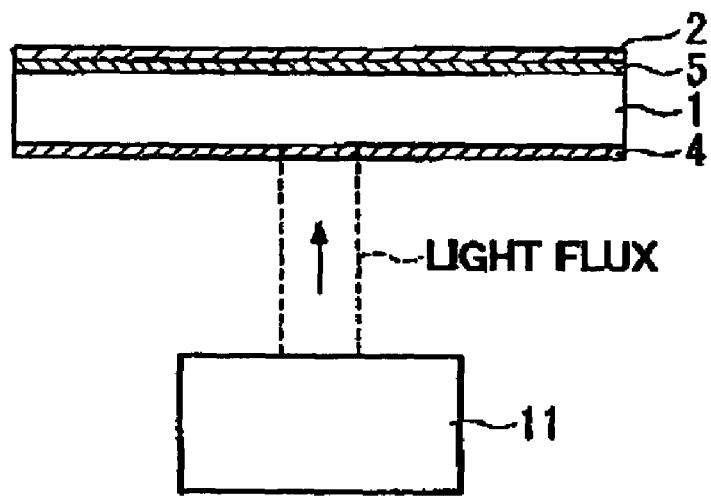
FIG. 4 is schematic view showing another embodiment of the pattern forming method of the present invention.
Figure 4B:
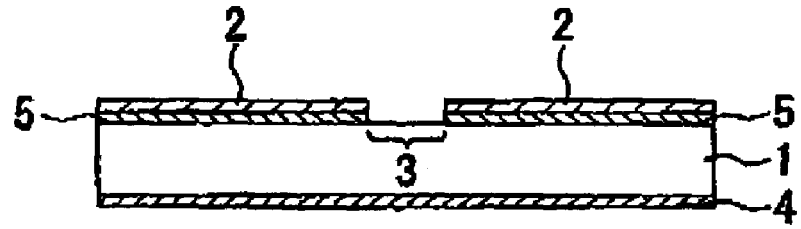

As shown in FIG. 4, a structure in which the photothermal conversion layer 4 is provided on the back surface side of the base material 1 where the thin film 2 and the sublimable dyestuff layer 5 are not provided. In this case, the light is preferably irradiated from the back surface side of the base material 1 (the surface side where the photothermal conversion layer 4 is provided). At this time, in order to favorably transmit thermal energy generated from the photothermal conversion layer 4 to the sublimable dyestuff layer 5 provided on the front surface side, a thickness and the material of the base material 1 are optimally selected. The photothermal conversion layer 4 may be provided on both of the front surface side and the back surface side of the base material 1.

Although in the embodiments described referring to FIGS. 1 through 4, the photothermal conversion material is provided in the layer (the photothermal conversion layer 4) independent of the base material 1, the sublimable dyestuff layer 5 and the thin film 2, a structure in which the photothermal conversion material is mixed in the base material 1 can be employed, and a structure in which the photothermal conversion material is mixed in the thin film 2 can also be employed. Even with these structures, the light energy of the irradiated laser light can be converted into thermal energy and the thermal energy can be supplied to the sublimable dyestuff layer 5. In addition to the base material 1 with the photothermal conversion material mixed, the photothermal conversion layer 4 may be provided separately.

Furthermore, although in the embodiments described referring to FIGS. 1 through 4, the photothermal dyestuff is provided in the layer (the sublimable dyestuff layer 5) independent of the base material 1, the photothermal conversion layer 4 and the thin film 2, a structure in which the thermal conversion material and the sublimable dyestuff are mixed in the base material 1 can be employed, and a structure in which the sublimable dyestuff is mixed in the thin film 2 can also be employed. Even with these structures, the sublimable dyestuff in a desired region is heated by the irradiated light and the thin film 2 in the desired region can be vaporized or decomposed by the sublimation of the sublimable dyestuff to pattern the thin film 2.

Furthermore, the photothermal conversion material may be mixed in the sublimable dyestuff layer 5. This allows the photothermal conversion material to be sublimated together when the sublimable dyestuff is sublimated and to be removed from the base material 1 as well.

Meanwhile, in the case where the photothermal conversion layer 4 containing the photothermal conversion material, the sublimable dyestuff layer 5 and the thin film 2 are provided independently, the photothermal conversion layer 4 may remain on the base material 1 even after irradiating the light, but for example, in the removal region 3 where the photothermal conversion layer 4 remains, a functional liquid containing a material exhibiting conductivity by heat treatment or optical treatment is arranged and the light is irradiated to the photothermal conversion layer 4 from the back surface side of the base material 1, which allows the material to exhibit the conductivity by the heat generated from the photothermal conversion layer 4. Here, as the material exhibiting the conductivity by heat treatment or light treatment, an organic silver compound described later or the like is exemplified.

In the case where the photothermal conversion layer conversion layer 4 is provided, light having a wavelength according to the photothermal conversion material is preferably irradiated. Specifically, since a favorably absorbed wavelength band of light varies according to the used photothermal conversion material, by irradiating the light having a wavelength according to the photothermal conversion material, the light energy can be efficiently converted into thermal energy. In other words, the photothermal conversion material to be used is selected according to the irradiated light. In the present embodiment, since the near infrared semiconductor laser (with a wavelength of 830 nm) is used as the laser light source, as the photothermal conversion material, a material having a property of absorbing the light in a range from infrared rays to visible light rays is preferably used.

In the case where the photothermal conversion layer 4 is provided between the base material 1 and the sublimable dyestuff layer 5, between the sublimable dyestuff layer 5 and the thin film 2 (or in the sublimable dyestuff layer 5), and in the case where the thin film 2 is formed on the base material 1, between the base material 1 and the thin film 2, there may be provided a gas generating layer containing a gas generating material that generates a gas by irradiating the light. The gas generating material, when absorbing the light or absorbing the thermal energy converted from the light energy, causes a decomposition reaction to emit nitrogen gas, hydrogen gas or the like, and it has a role to supply energy to remove the thin film 2 by the generated gas. As such a gas generating material, at least one substance selected from the group consisting of pentaerythritol tetranitrate (PETN), and trinitrotoluene (TNT), or the like, or GAP (glycidyl azide polymer) or the like is exemplified.

Furthermore, between the photothermal conversion layer 4 and the sublimable dyestuff layer 5, an intermediate layer for uniformizing the photothermal converting action of the photothermal conversion layer 4 can be provided. As such an intermediate layer forming material, a resin material capable of satisfying the above-mentioned requirement can be exemplified. Such an intermediate layer can be formed by applying a resin composition having a predetermined composition on a front surface of the photothermal conversion layer 4, based on a publicly known coating method for example such as a spin coating method, a gravure coating method, and a dye coating method, and drying the same. When the laser light flux is irradiated, the action of the photothermal conversion layer 4 converts the light energy into thermal energy, and further this thermal energy is uniformized by the action of the intermediate layer. Accordingly, the uniform thermal energy is supplied to a part of the sublimable dyestuff layer 5 corresponding to the light irradiation region.

Next, as one example of the forming method of the thin film (monomolecular film) 2, a self assembled film forming method is described. In the self assembled film forming method, the self assembled film composed of an organic molecular film is formed on the front surface of the base material 1. The organic molecular film has a functional group capable of bonding to the base material 1 and a linear structure for inducing an intermolecular interaction, and it bonds to the base material 1 and is self-assembled to form a molecular film, for example monomolecular film.

Here, the self-assembled film (self-assembled monolayer: SAM) is a monomolecular film having a high orientation, which is formed by adsorbing organic molecules to the surface of the base material by an interaction between a polarized part of the organic molecule with an active interface and the base material surface, and by assembling organic molecules by an intermolecular interaction exerted in an unpolarized part to orderly align on the surface. Accordingly, the self assembled film has a thickness of exactly one molecular layer, and organic molecules having various functions can be used as the self assembled film.

By using the above-mentioned fluoroalkylsilane (FAS) as the above-mentioned compound having a high orientation, the compounds are oriented so as to locate fluoroalkyl groups on the surface of the film to form the self assembled film, and an uniform liquid repellent is imparted on the surface of the film. As FAS which is a compound forming such a self assembled film, fluoroalkylsilane such as heptadecafluoro-1,1,2,2 tetrahydrodecyl triethoxysilane, heptadecafluoro-1,1,2,2 tetrahydrodecyl trimethoxysilane, heptadecafluoro-1,1,2,2 tetrahydrodecyl trichlorosilane, tridecafluoro-1,1,2,2 tetrahydrooctyl triethoxysilane, tridecafluoro-1,1,2,2 tetrahydrooctyl trimethoxysilane, tridecafluoro-1,1,2,2 tetrahydrooctyl trichlorosilane, and trifluoropropyl trimethoxysilane, or the like are exemplified. These compounds may be used alone or in combination of two or more. The use of FAS can bring about adhesion with the base material and a favorable liquid repellent.

FAS is generally represented by structural formula, Rn—Si—X (4-n). Here, n represents an integer not less than one and not more than 3, X represents a hydrolytic group such as a methoxy group, an ethoxy group and a halogen atom. R is a fluoroalkyl group, and has a structure of (CF3) (CF2) x (CH2) y (wherein x represents an integer not less than 0, and y represents an integer not less than 0), and in the case where a plurality of R or X is bonded to Si, R or X may be all same or may be the different. The hydrolytic group represented by X forms silanol by hydrolysis, and reacts to a hydroxyl group of a base of the substrate (glass, silicon) to bond to the substrate by siloxiane bond. On the other hand, since R has a fluoro group such as (CF3) on a surface thereof, it modifies the base surface of the substrate into a non-wet surface (whose surface energy is low).

Figure 5:
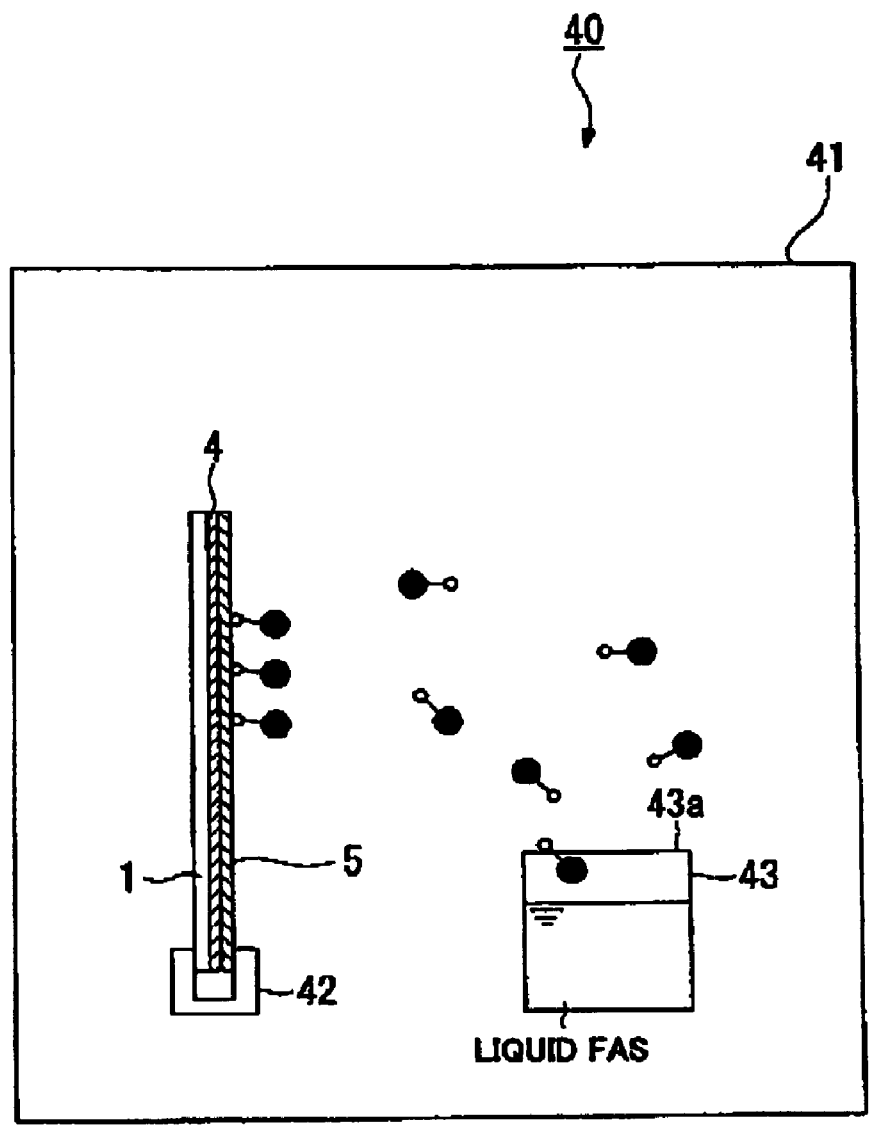
FIG. 5 is a schematic view showing one example of a forming procedure of a thin film according to the present invention.

FIG. 5 is a schematic structural view of an FAS treatment device 40 forming the self assembled film (FAS film) composed of FAS on the base material 1 (the sublimable dyestuff layer 5). The FAS treatment device 40 forms the self assembled film (FAS film) composed of FAS on the base material 1 (the sublimable dyestuff layer 5). As shown in FIG. 5, the FAS treatment device 40 comprises a chamber 41, a holder 42 arranged in the chamber 41 and holding the base material 1, and a container 43 containing FAS in a liquid phase state (liquid FAS). The base material 1 and the container 43 containing the liquid FAS are left in the chamber 41 under a room temperature environment, thereby emitting the liquid FAS in the container 43 in a gas phase from an opening part 43a of the container 43 to the chamber 41. And after about two or three days, for example, the self-assembled film composed of the FAS is formed on the base material 1 (the sublimable dyestuff layer 5). Furthermore, the whole chamber 41 is maintained at about 100° C., thereby forming the self assembled film on the base material 1 (the sublimable dyestuff layer 5) after about three hours. Here, the forming method from a gas phase is described, however, the self assembled film can be formed from a liquid phase. For example, the base material 1 is immersed in a solution containing a raw material compound and is cleaned and dried to thereby form the self assembled film on the base material 1.

As the liquid repellent film, a fluorination treated film formed by a plasma treatment method may be used. In the plasma treatment method, plasma irradiation is carried out with respect to a substrate at normal pressures or in vacuum. As a type of gas used for the plasma treatment, various types can be selected in view of the surface material of the base material 1 to form a wiring pattern on or the like. As a treatment gas, for example, tetrafluoromethane, perfluorohexane, perfluorodecane or the like can be exemplified.

Figure 6:
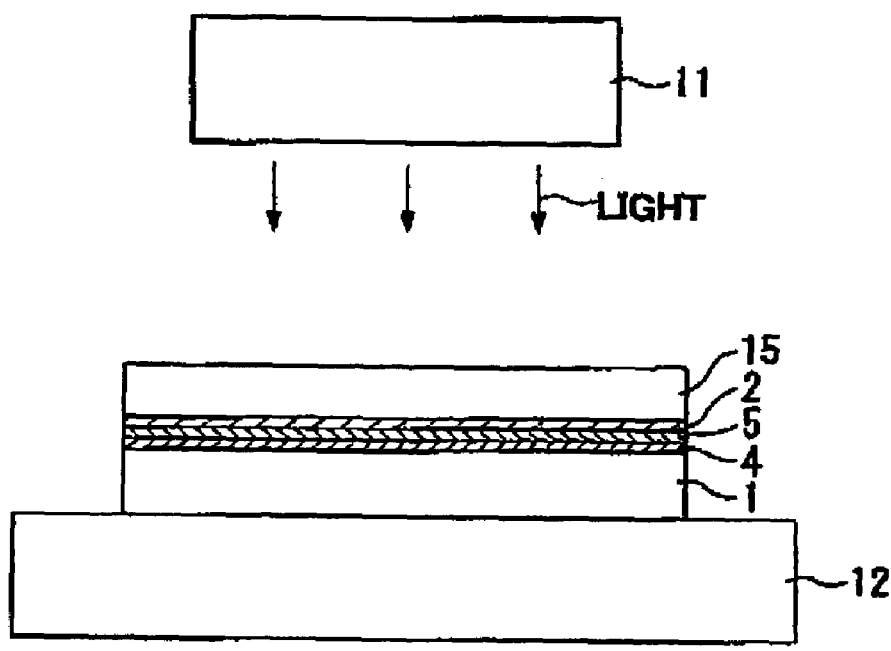
FIG. 6 is a schematic structural view showing another embodiment of the pattern forming device for use in the pattern forming method of the present invention.

FIG. 6 is a view showing the way to irradiate infrared laser light to the base material 1 subjected to the FAS treatment through a mask 15 having a predetermined pattern. As shown in FIG. 6, when forming a thin film pattern, light flux may be irradiated to the mask 15 having a pattern according to the thin film pattern to be formed, and the light through the mask 15 may be irradiated to the base material 1 having the photothermal conversion layer 4 and the sublimable dyestuff layer 5. In FIG. 6, the mask 15 is arranged so as to be in close contact with the thin film 2 on the base material 1 supported by the stage 12. The light flux emitted from the light source 11 illuminates the mask 15. The light passing through the mask 15 is irradiated to the base material 1 supported by the stage 12. Based on the irradiated light, a part of the thin film 2 is removed by the heat generated from the photothermal conversion layer 4 together with the sublimation of the sublimable dyestuff layer 5, and the thin film pattern is formed. The use of the mask 15 allows a finer thin film pattern than a diameter of the light flux emitted from the laser light source 11 to be formed. On the other hand, as described referring to FIG. 1, by plotting the thin film pattern (the removal region 3) while relatively moving the light flux and the base material 1, the process of manufacturing the mask 15 can be omitted.

In the example shown in FIG. 6, the light is irradiated to the mask 15 in the state that the mask 15 and the base material 1 are in close contact with each other, however, the light may be irradiated to the mask 15 in a state that the mask 15 and the base material 1 are separated, so that the light through the mask 15 may be irradiated to the base material 1.

<Wiring Pattern Forming Method>

Figure 7:
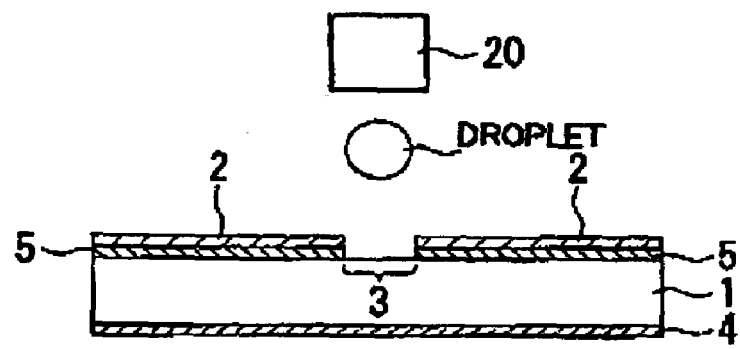
FIG. 7 is a schematic view showing one embodiment of a wiring pattern forming method of the present invention.

Hereinafter, a method for forming a wiring pattern on the base material 1 having the thin film pattern formed by the above-described method is described. FIG. 7 is a schematic view showing the method for forming the wiring pattern on the base material 1 with the pattern of the thin film 2 formed. According to the present embodiment, in order to arrange a wiring pattern forming material on the base material 1, there is used a droplet discharging method (ink jet method) in which a droplet of a functional liquid containing the wiring pattern forming material is discharged. In the droplet discharging method, the droplet of the functional liquid containing the wiring pattern forming material is discharged to the removal region 3 of the thin film 2 from a discharging head 20 in a state that the discharging head 20 and the base material 1 are opposed to each other. Here, the thin film (monomolecular film) 2 has liquid repellent and the removal region 3 has lyophilic by removing the thin film 2 therefrom. Furthermore, in the present embodiment, as shown in FIG. 7, on the front surface side of the base material 1, the thin film 2 and the sublimable dyestuff layer 5 are provided, and on the back surface side, the photothermal conversion layer 4 is provided.

Here, as a discharging technique of the droplet discharging method, an electric charge control method, a pressurized vibrating method, an electrothermal conversion method, an electrostatic absorbing method, an electromechanical conversion method or the like are exemplified. In the electric charge control method, a material is electrified by an electrifying electrode and a flying direction of the material is controlled by a deflecting electrode to discharge the material from a discharging nozzle. In the pressurized vibrating method, an ultra-high pressure of about 30 kg/cm2 is applied to the material to discharge the material at the nozzle tip end side. And in the case where a control voltage is not applied, the material goes straight to be discharged from the discharging nozzle, and in the case where the control voltage is applied, an electrostatic repulsion occurs among the material, and the material flies, thereby preventing the material from being discharged. In the electrothermal conversion method, the material is rapidly vaporized by a heater provided in a space where the material is stored to generate bubbles and the material in the space is discharged by the pressure of the bubbles. In the electrostatic absorbing method, micro pressure is applied to the inside of the space where the material is stored to form meniscus of the material in the discharging nozzle, and in this state, electrostatic absorbing is applied to draw out the material. In the electromechanical conversion method, a property that a piezo actuator (piezoelectric element) is deformed by receiving a pulse-like electric signal is used. And by deforming the piezo actuator, pressure is applied to the space where the material is stored through a flexible substance, and the material is pushed out from this space to be discharged from the discharging nozzle. In addition, a technology such as a method of using change in viscosity of a fluid by an electric field, and a method of making the material fly by electric discharge spark are applicable. The liquid discharge method has advantages that the material can be used less wastefully, and that a desired amount of material can be arranged precisely at a desired position. The quantity of one drop of the liquid material discharged by the droplet discharging method is 1 through 300 nanograms, for example. In the present embodiment, the electromechanical conversion method (piezo method) is used.

Figure 8:
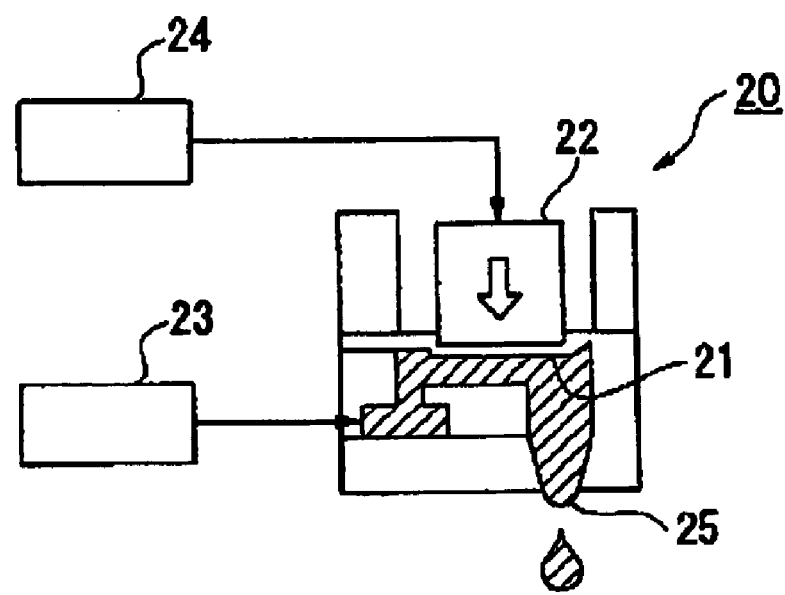
FIG. 8 is a schematic structural view showing a discharging head for use in the wiring pattern forming method of the present invention.

FIG. 8 is a view for explaining a principle of discharging the functional liquid (liquid material) by the piezoelectric method. In FIG. 8, the discharging head 20 comprises a liquid chamber 21 containing a functional liquid (liquid material containing a wiring pattern forming material) and a piezo actuator 22 set up adjacently to the liquid chamber 21. To the liquid chamber 21, the functional liquid is supplied through a supply system 23 including a material tank containing the functional liquid. The piezo actuator 22 is connected to a drive circuit 24, and voltage is applied to the piezo actuator 22 through this drive circuit 24 to deform the piezo actuator 22. Thereby, the liquid chamber 21 is deformed and the functional liquid is discharged from a discharging nozzle 25. In this case, by changing a value of the applied voltage, a distortion amount of the piezo actuator 22 is controlled. Furthermore, by changing a frequency of the applied voltage, a distortion speed of the piezo actuator 22 is controlled. The droplet discharge by the piezo method has an advantage that since the material is not heated, a composition of the material is hardly affected.

Hereinafter, a procedure for forming a wiring pattern is described. After the base material 1 is cleaned using a predetermined solvent or the like, the photothermal conversion layer 4 is provided on the base material 1 by the above-mentioned method. Next, lyophilic is imparted to the base material 1 by ultraviolet ray (UV) irradiation treatment or O2 plasma treatment. Next, the sublimable dyestuff layer 5 and the thin film 2 are formed by the above-described method, and the light is irradiated to form the thin film pattern. Thereby, in a part of the thin film 2 having liquid repellent on the base material 1, the removal region 3 having lyophilic is formed.

Next, a material arrangement step is performed, in which using the discharging head 20, the droplet of the functional liquid containing the wiring pattern forming material is arranged in the removal region 3 on the base material 1. Here, an organic silver compound is used as a conductive material composing the wiring pattern forming material, and diethylene glycol diethyl ether is used as a solvent, and the functional liquid containing the organic silver compound is discharged. In the material arrangement step, as shown in FIG. 7, the functional liquid containing the wiring pattern forming material is discharged as a droplet from the discharging head 20. The discharged droplet is arranged in the removal region 3 on the base material 1. At this time, since the periphery of the removal region 3 having lyophilic is surrounded by the thin film 2 having liquid repellent, the droplet can be prevented from spreading to other than a predetermined position. Furthermore, owing to the liquid repellent of the thin film 2, even if a part of the discharged droplet is placed on the thin film 2, it flows down to the removal region 3. Furthermore, since the removal region 3 where the base material 1 is exposed has been imparted lyophilic, the discharged droplet is spread more easily in the removal region 3, and thus the functional liquid is uniformly arranged at the predetermined position.

As the functional liquid, a dispersion liquid in which conductive fine particles are dispersed in a dispersion medium can be used. As the conductive fine particles, there are used for example, metal fine particles containing at least any one of gold, silver, copper, aluminum, palladium and nickel, and fine particles of oxides of these, and fine particles of conductive polymers and superconductive materials or the like. These conductive fine particles are produced by a vaporization method in gas, a sputtering method, a metal vapor synthesis method, a vacuum vaporization method on fluid oil, a colloid method, an alcoxide method, a coprecipitation method, a homogeneous precipitation method, an organic compound thermal decomposition method, a reduction method in hydrogen, a solvent vaporization method or the like. And in order to prevent secondary particles from being formed due to aggregation, the respective surfaces of the fine particle are coated with organic molecules of a dispersion agent or the like as necessary. The dispersion medium is not particularly limited as long as it can disperse the above-mentioned conductive fine particles and does not cause aggregation. For example, in addition to water, there can be exemplified alcohols such as methanol, ethanol, propanol and butanol, hydrocarbon based compounds such as n-heptan, n-octane, decane, dodecane, tetradecane, toluene, xylene, cymene, durene, indene, dipentene, tetrahydronaphthalene, decahydronaphthalene, and cyclohexylbenzene, ether based compounds such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyetane, bis (2-methoxyethyl) ether, and p-dioxane, and further polar compounds such as propylene carbonate, γ-butyrolactone, N-methyl-2-pyrrolidone, dimethylformamide, dimethylsulfoxide, and cyclohexanon, or the like. Among these, in view of dipersibility of the fine particles and stability of the dispersion liquid, and easy application to the droplet discharging method, water, alcohols, hydrocarbon based compounds, ether based compounds are preferable, and as the more preferable dispersion medium, water and hydrocarbon based compounds can be exemplified.

After the material arrangement step (droplet discharging step), a calcination step is carried out. By performing the baking process with respect to the functional liquid containing the conductive material, conductivity can be obtained. In particular, in the case of the organic silver compound, the calcination process is carried out to remove the organic contents and leave the silver particles, thereby generating the conductivity. Therefore, as the calcination process, at least one of thermal treatment or optical treatment is applied to the base material 1 after the material arrangement step. Although the heat treatment/optical treatment is normally carried out in the atmosphere, it can also be carried out in the inert gas atmosphere such as nitrogen, argon and helium. A treatment temperature of the heat treatment/optical treatment is determined in each case, taking into consideration a boiling point of the solvent (vapor pressure), a type and a pressure of the atmosphere gas, dispersibility of the fine particles and thermal behaviors of the organic silver compound, the oxide or the like, existence and the amount of the coating material, a heat-resistance temperature of the base material, or the like. For example, in order to remove the organic contents of the organic silver compounds, it needs to be calcined at about 200° C. Furthermore, in the case such a substrate as plastic is used, calcination is preferably carried out at temperatures not less than a room temperature and not more than 100° C. According to the above-described step, the conductive material (the organic silver compound) after discharging step is converted into a wiring pattern having the conductivity due to the remaining silver particles.

After the material arrangement step, an intermediate drying step (or the calcination step) is carried out, and the material arrangement step and the intermediate drying step (calcination step) are alternately repeated several times, so that the wiring pattern forming material can be deposited in the removal region 3.

At predetermined timing such as after the calcination step and after the light irradiation step for forming the thin film pattern (the removal region 3), the photothermal conversion layer 4 provided on the back surface of the base material 1 can be removed. For example, by cleaning with a predetermined solvent, the photothermal conversion layer 4 can be removed from the base material 1. Furthermore, at a predetermined timing such as after the material arrangement step (droplet discharging step) and after the calcination step, all the thin film 2 on the base material 1 can also be removed. For example, irradiation of the laser light can remove all the thin film 2 from the base material 1.

In the present embodiment, the droplet discharging method is used to form the wiring pattern, however, the wiring pattern forming material can be arranged in the removal region 3 by a plating method, for example.

<Plasma Display Device>

Figure 9:
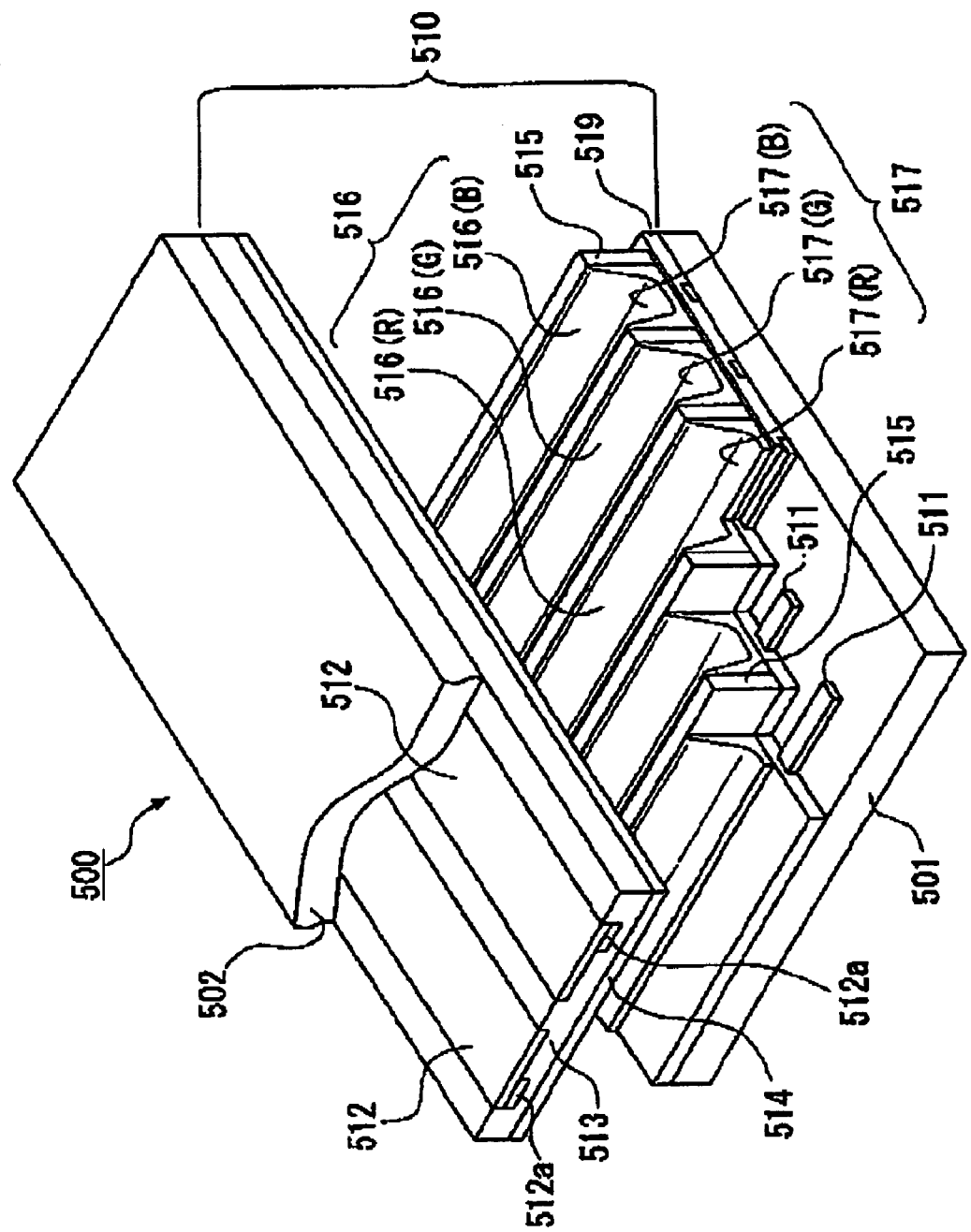
FIG. 9 is an exploded perspective view of a plasma display showing one example of an electro-optic device having the wiring pattern formed by the wiring pattern forming method of the present invention.

Next, as one example of an electro-optic device having the wiring pattern formed by the wiring pattern forming method of the present invention, a plasma display (plasma display device) is described referring to FIG. 9. FIG. 9 is an exploded perspective view showing a plasma display 500 in which address electrodes 511 and bus electrodes 512a are manufactured. This plasma display 500 is schematically composed of a glass substrate 501 and a glass substrate 502 arranged opposite to each other, and an electric discharge display part 510 formed between them.

The electric discharge part 510 is composed by assembling a plurality of electric discharge chambers 516, and is arranged in such a manner that among the plurality of electric discharge chambers 516, three electric discharge chambers of the red electric discharge chamber 516 (R), the green electric discharge chamber 516 (G) and a blue discharge chamber 516 (B) make a set to compose one pixel. On an upper surface of the (glass) substrate 501, the address electrodes 511 are formed in stripes at predetermined intervals. And a dielectric layer 519 is formed so as to cover the address electrodes 511 and the upper surface of the substrate 501, and further on the dielectric layer 519, dividing walls 515 are formed between the address electrodes 511 and 511 along the respective address electrodes 511. In the dividing wall 515, there are also partitions (omitted in the figure) at longitudinal predetermined positions in a direction perpendicular to the address electrodes 511, and basically, rectangular regions demarcated by the adjacent dividing walls on both bilateral sides in a width direction of the address electrodes 511 and the dividing walls extending in the direction perpendicular to the address electrodes 511 are formed, the electric discharge chambers 516 are formed so as to correspond to these rectangular regions, and three of these rectangular regions make a set to compose one pixel. Furthermore, inside of each of the rectangular regions demarcated by the dividing walls 515, a fluorescent substance 517 is arranged. The fluorescent substance 517 emits any of red, green and blue fluorescence, and at a bottom part of the red electric discharge chamber 516 (R), the red fluorescent substance 517 (R) is arranged, and at a bottom part of the green electric discharge chamber 516 (G), the green fluorescent substance 517 (G) is arranged, and at a bottom part of the blue electric discharge chamber 516 (B), the blue fluorescent substance 517 (B) is arranged, respectively.

Next, on the glass substrate 502 side, transparent display electrodes 512 composed of a plurality of ITOs are formed in stripes at predetermined intervals in the direction perpendicular to the address electrodes 511 above-mentioned, and the bus electrodes 512a made of metal are formed in order to compensate for highly resistive ITOs. A dielectric layer 513 is formed so as to cover these, and further, a protective film 514 made of MgO or the like is formed. The substrate 501 and the substrate 2 of the glass substrate 502 are opposed to each other in such a manner that the address electrodes 511, and the display electrodes 512 . . . are perpendicular to each other to be stuck to each other, and air is evacuated from a space part encompassed by the substrate 501, the dividing walls 515 and the protective layer 514 formed on the glass substrate 502 side and a rare gas is charged to thereby form the electric discharge chamber 516. The display electrodes 512 formed on the glass substrate 502 side are formed in such a manner as to arrange two for each of the electric discharge chambers 516. The address electrodes 511 and the display electrodes 512 are connected to an AC power supply omitted in the figure, and by energizing the respective electrodes, the fluorescent substance 517 of a necessary position is excited to emit light in the electric discharge display part 510, thereby enabling color display.

In this example, especially, the address electrodes 511 and the bus electrodes 512a are formed by the wiring pattern forming method according to the present invention. Specifically, these address electrodes 511 and the bus electrodes 512a are formed by discharging a functional liquid having a metal colloid material (for example, gold colloid or silver colloid) or conductive fine particles (for example, metal fine particles) dispersed, and drying/calcining the functional liquid, which is advantageous especially for the patterning. Furthermore, the fluorescent substance 517 can also be formed by discharging a functional liquid having the fluorescent substance material dissolved in a solvent or dispersed in a dispersion medium from the discharging head 20 and drying/calcining the functional liquid.

<Color Filter>

Next, a procedure for manufacturing a color filter of a liquid crystal display device using the thin film according to the present invention is described referring to FIG. 10. The thin film in the present embodiment is not a monomolecular film but is composed of an organic thin film having a predetermined height (thickness), and comprises banks (black matrixes) demarcating predetermined regions on a base material. Firstly, as shown in FIG. 10 (a), on one surface of a transparent substrate (base material) P, the black matrixes (banks) 52 are formed. These black matrixes 52 demarcate color filter forming regions, and are formed by a bank forming method according to the present invention. When forming the black matrixes (banks), the use of a black sublimable material together with a photoinitiator and a monomer can cure the black matrixes in the light irradiation step later.

Figure 10A:
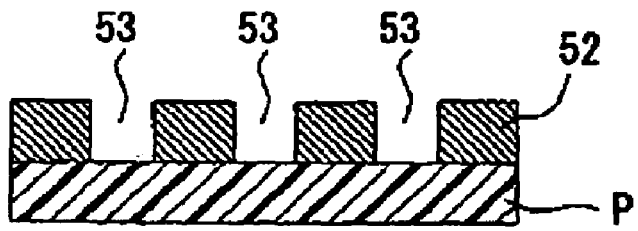
FIG. 10 is view showing one example of an electro-optic device manufactured using the thin film formed by the pattern forming method of the present invention, and they are views showing one example of a manufacturing step of a color filter of a liquid crystal display device.
Figure 10B:
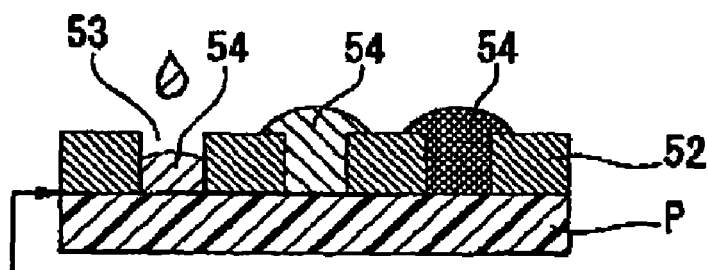

Next, as shown in FIG. 10(b), droplets 54 of a functional liquid for color filter are discharged from the discharging head 20 to touch down in filter elements 53. The amount of the functional liquid 54 to be discharged is set to a sufficient one in view of a volume reduction of the functional liquid in the heating step (drying/calcination step).

Figure 10C:
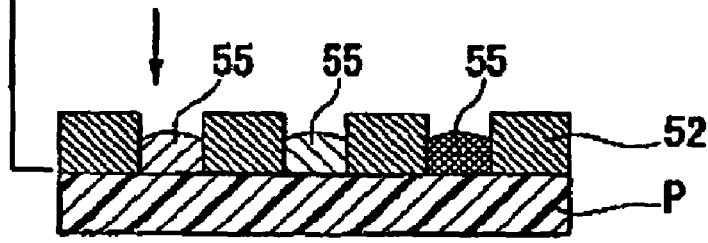
Figure 10D:
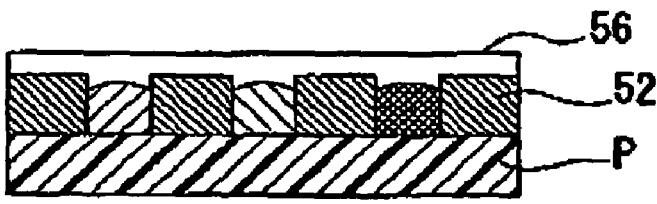

In this manner, after charging the droplets 54 to all the filter elements 53 on the substrate P, heating treatment is carried out so that the substrate P reaches a predetermined temperature (for example, about 70° C.) using a heater. This heating treatment vaporizes a solvent of the functional liquid and reduces the volume of the functional liquid. When the reduction in volume is large, the droplet discharging step and the heating step are repeated until a sufficient thickness of the film as a color filter is obtained. By this process, the solvent contained in the functional liquid evaporates and only the solid contents (functional material) contained in the functional liquid finally remain and form films to make into color filters 55 as shown in FIG. 10(c).

Figure 10E:
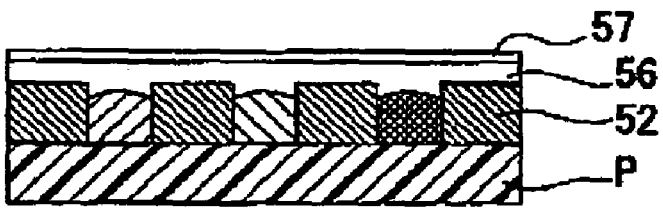
Figure 10F:
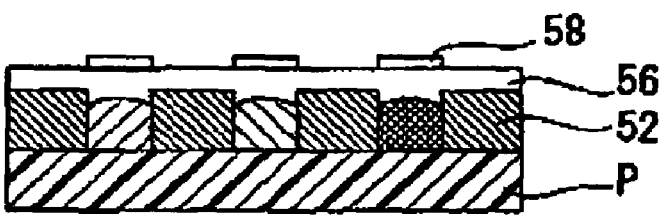

Next, in order to flatten the substrate P and protect the color filters 55, a protective film 56 is formed on the substrate P in such a manner as to cover the color filters 55 and the black matrixes 52. When forming the protective layer 56, although a spin coating method, a roll coating method, a ripping method or the like can be employed, as in the case of the color filters 55, the discharge device can be used. Next, as shown in FIG. 10(e), on the entire surface of this protective layer 56, a transparent conductive film 57 can be formed by a sputtering method, a vacuum deposition method or the like. Thereafter, the transparent conductive film 57 is patterned, and as shown in FIG. 10(f), pixel electrodes 58 are patterned corresponding to the filter elements 53. In the case where a TFT (thin film transistor) is used to drive a liquid crystal display panel, this patterning is not necessary. In such manufacturing of the color filter, since the discharging head 20 is used, the color filter material can be discharged continuously without trouble, so that a favorable color filter can be formed, and productivity can be improved.

<Organic EL Display Device>

Figure 11:
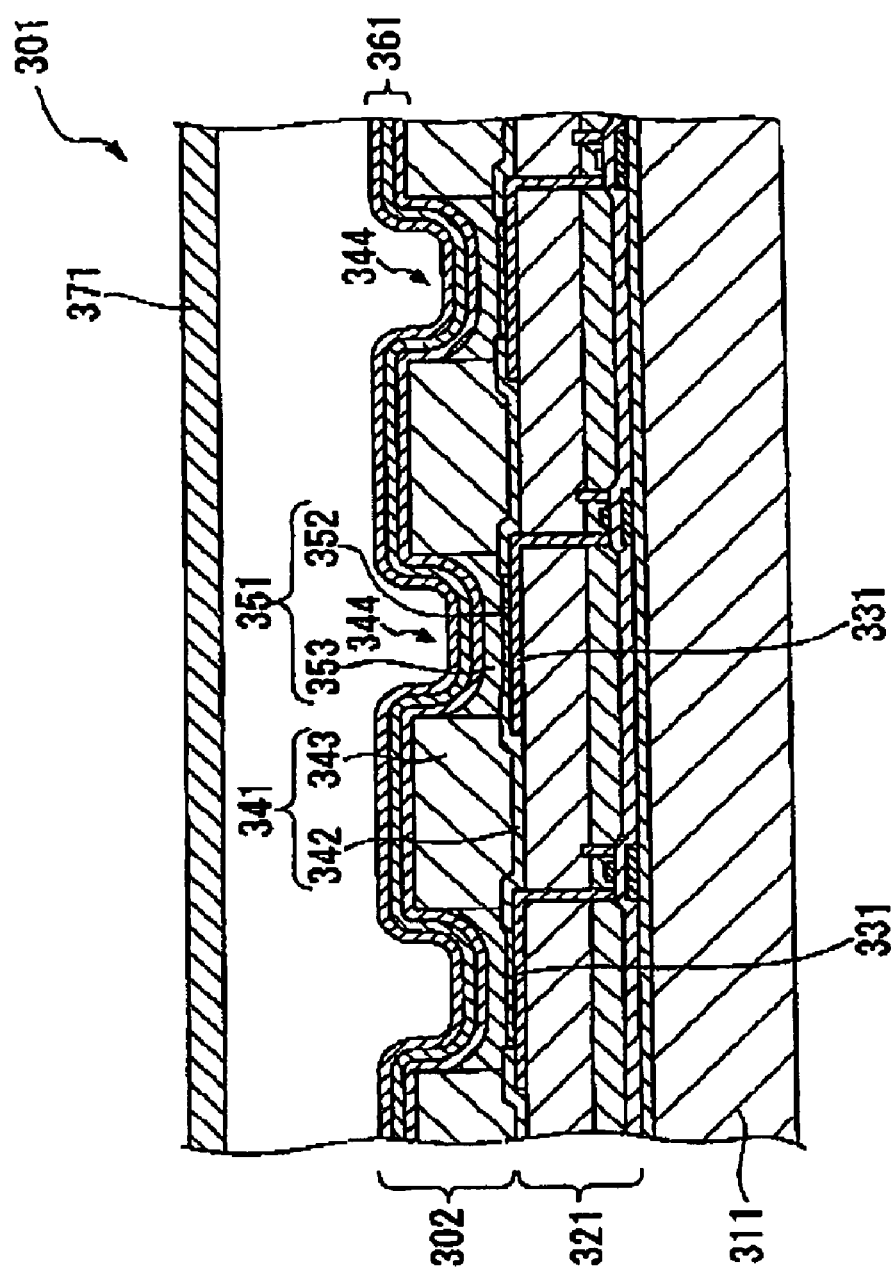
FIG. 11 is a view showing one example of an electro-optic device manufactured using the thin film formed by the pattern forming method of the present invention, and it is a cross-sectional side view showing an organic EL display device.

Next, a procedure for manufacturing an organic EL display device using the banks according to the present invention is described referring to FIG. 11. A thin film in the present embodiment is not a monomolecular film, either, but is composed of an organic thin film having a predetermined height (thickness), and comprises banks demarcating predetermined regions on a base material. FIG. 11 is a cross-sectional side view of the organic EL display device in which a part of components thereof are manufactured by the discharging head 20, and a schematic structure of this organic EL display device is first described. The organic EL display device formed here is one embodiment of an electro-optic device in the present invention. As shown in FIG. 11, in this organic EL device 301, to an organic EL element 302 comprising a substrate (base material) 311, a circuit element part 321, pixel electrodes 331, bank parts 341, light emitting elements 351, a negative electrode 361 (counter electrode), and a sealing substrate 371, there are connected wiring of a flexible substrate (omitted in the figure) and a drive IC (omitted in the figure). The circuit element part 321 is formed on the substrate 311 and the plurality of pixel electrodes 331 are aligned on the circuit element part 321. Between the respective pixel electrodes 331, the bank parts 341 are formed in grids. And at concave part openings 344 generated due to the bank parts 341, the light emitting elements 351 are formed. The negative electrode 361 is formed in the whole upper surfaces of the bank parts 341 and the light emitting elements 351, and on the negative electrode 361, the sealing substrate 371 is deposited.

Each of the bank parts 341 is composed of a first bank 342 and a second bank 343 deposited thereon. When forming this bank part 341, the thin film pattern forming method according to the present invention is used.

A manufacturing process of an organic EL display device 301 containing the organic EL element comprises a bank part forming step for forming the bank parts 341, a plasma treatment step for properly forming the light emitting elements 351, a light emitting element forming step for forming the light emitting elements 351, a counter electrode forming step for forming the negative electrode 361, and a sealing step for depositing the sealing substrate 371 on the negative electrode 361 and sealing it.

In the light emitting element forming step, each of the light emitting elements 351 is formed by forming a hole injection layer 352 and a light emitting layer 353 on the pixel electrode 331, and the step comprises a hole injection layer forming step and a light emitting layer forming step. And the hole injection layer forming step has a first discharging step of discharging a first functional liquid for forming the hole injection layer 352 on each of the pixel electrodes 331, and a first drying step of drying the discharged first functional liquid to form the hole injection layer 352. The light emitting layer forming step has a second discharging step of discharging a second functional liquid for forming the light emitting layer 353 on the hole injection layer 352, and a second drying step of drying the discharged second functional liquid to form the light emitting layer 353.

In this light emitting element forming step, the discharging head 20 is used for the first discharging step in the hole injection layer forming step and the second discharging step in the light emitting layer forming step.

<Electronic Equipment>

Figure 12A:
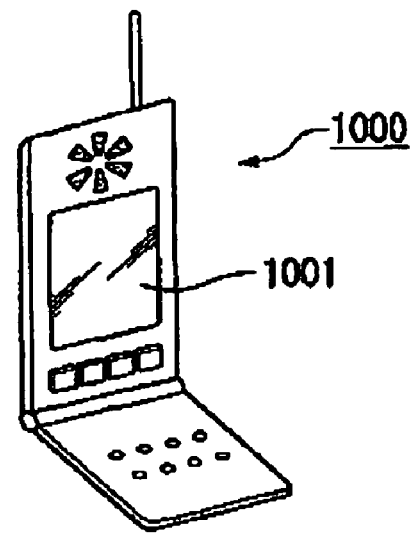
FIG. 12 is view showing examples of electronic equipment each having the electro-optic device.
Figure 12B:
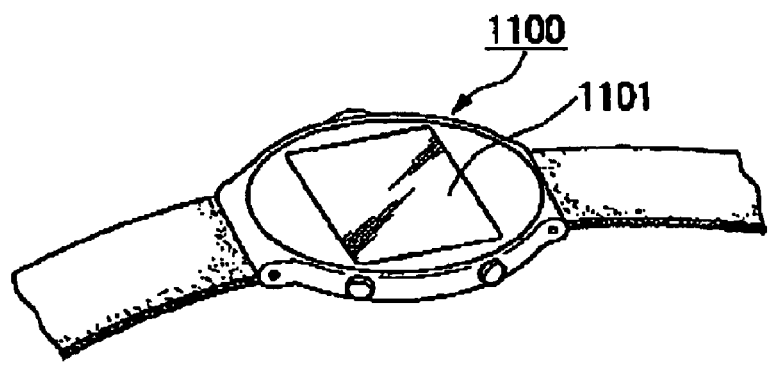
Figure 12C:
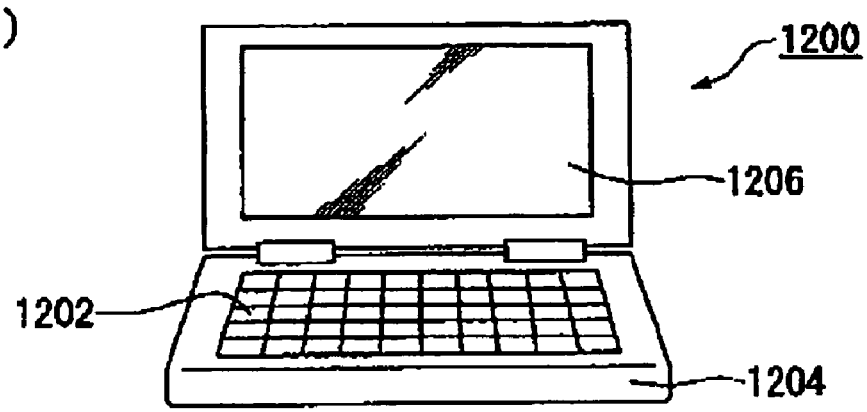

Hereinafter, application examples of electronic equipment comprising the above-mentioned electro-optic device (the liquid crystal display device, the organic EL display device, the plasma display device or the like) is described. FIG. 12(a) is a perspective view showing one example of a cellular phone. In FIG. 12(a), reference numeral 1000 denotes a cellular phone body, and reference numeral 1001 denotes a display part using the above-mentioned electro-optic device. FIG. 12(b) is a perspective view showing one example of wristwatch type electronic equipment. In FIG. 12(b), reference numeral 1100 denotes a watch body, and reference numeral 1101 denotes a display part using the above-mentioned electro-optic device. FIG. 12(c) is a perspective view showing one example of a portable information processing device such as a word processor and a personal computer. In FIG. 12(c), reference numeral 1200 denotes an information processing device, reference numeral 1202 denotes an input part such as a keyboard, reference numeral 1204 denotes an information processing device body, and reference numeral 1206 denotes a display part using the above-mentioned electro-optic device. The electronic equipment shown in FIGS. 12(a) through 12(c) comprises electro-optic devices of the above mentioned embodiments, and thus electronic equipment comprising a display part excellent in display quality (particularly, in resolution) with a bright screen can be realized at low cost.

In addition to the above-mentioned examples, other examples include a liquid crystal television, a viewfinder type or monitor direct-viewing type video tape recorder, a car navigation device, a pager, an electronic databook, an electric calculator, a word processor, a work station, a picture phone, a POS terminal, an electronic paper, equipment comprising a touch panel, or the like. The electro-optic device of the present invention is also applicable as a display part of the above-mentioned electronic equipment.

<Microlens>

FIG. 13 is view showing one example of a step of forming a microlens using the thin film pattern according to the present invention. The thin film in the present embodiment is composed of a monomolecular film having liquid repellent, which is made of an FAS film or the like, for example.

Figure 13A:
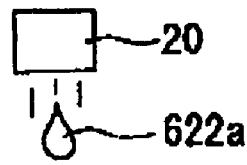
FIG. 13 is schematic view showing a procedure for forming a microlens using the thin film pattern according to the present invention.
Figure 13A:
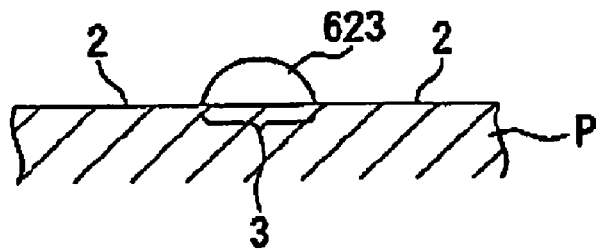
Figure 13B:
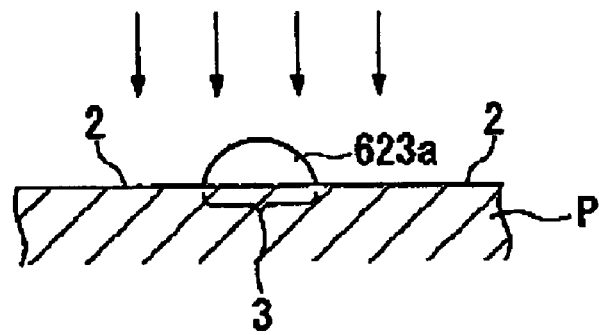
Figure 13C:
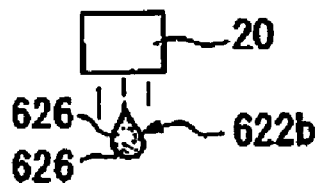
Figure 13C:
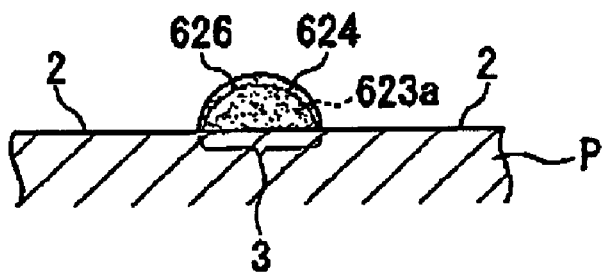
Figure 13D:
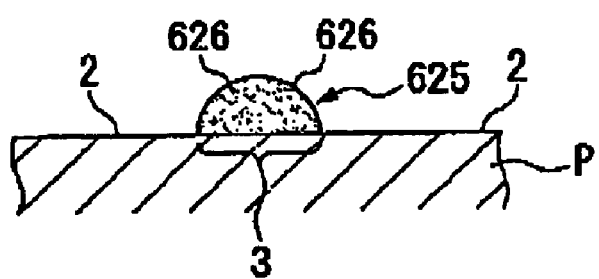

In the present example, as shown in FIG. 13(a), a droplet 622a composed of a light transmissive resin is discharged on the substrate (base material) P from the discharging head 20 and is applied thereto. When discharging the droplet 622a from each discharging head 20, the thin film pattern according to the present invention is formed on the substrate P in prior to the discharge, and the droplet 622a is arranged in the removal region 3 having lyophilic.

As the substrate P, in the case where the resultant microlens is applied to an optical film for screen, for example, there is used a light transmissive sheet or a light transmissive film composed of a cellulose based resin such as acetylcellulose and propylcellulose, or a transparent resin (light transmissive resin) such as polyvinylchloride, polyethylene, polypropylene and polyester. Furthermore, as the substrate, there can also be used a substrate composed of a transparent material (light transmissive material) such as glass, polycarbonate, polyarylate, polyethersulfon, amorphous polyolefin, polyethylene terephthalate, and polymethylmethacrylate or the like.

As the light transmissive resin, there are exemplified a thermoplastic or thermosetting resin including an acryl based resin such as polymethyl methacrylate, polyhydroxyethyl methacrylate, polycyclohexyl methacrylate, an allyl based resin such as polydiethyleneglycol bisallylcarbonate and polycarbonate, a methacrylic resin, a polyurethane based resin, a polyester based resin, a polyvinylchloride based resin, a polyvinyl acetate based resin, a cellulose based resin, a polyamide based resin, fluorocarbon based resin, a polypropylene based resin, and a polystyrene based resin, and any one of these resins is used, or a plurality of resins are mixed to be used.

However, in the present example, a radiation irradiating cured type is particularly used as the light transmissive resin. This radiation irradiating cured type is obtained by blending a photo polymerization initiator such as a biimidazole based compound in the light transmissive resin. And the blending of the photo polymerization initiator imparts radiation irradiating curability. The radiation is a generic term for visible light rays, ultraviolet rays, far ultraviolet rays, X rays, electron beam or the like, and in particular, ultraviolet rays are generally used.

Based on the size of a desired single microlens, one or a plurality of droplets 622a of such a radiation irradiating cured type light transmissive resin are discharged on the substrate P. Consequently, a light transmissive resin 623 composed of such a droplet 622 is given a convex shape (substantially semispherical shape) by surface tension thereof as shown in FIG. 13(*a*). In this manner, a predetermined amount of light transmissive resin is discharged and applied with respect to the single microlens to be formed. Further, this application process is carried out for the desired number of the microlenses, and then the radiation such as ultraviolet rays are irradiated to the light transmissive resin 623 and cure it to form a cured substance 623*a* as shown in FIG. 13(*b*). Although a volume per drop of the droplet 622*a* discharged from the discharging head 20 varies depending on the discharging head 20 or a discharged ink material, it is normally set to about 1 pL to 20 pL.

Next, as shown in FIG. 13(*c*), on each cured substance 623*a*, a desired number of droplets 622*b* having a number of light diffusive fine particles 626 dispersed are discharged, and attached to surfaces of the cured substance 623*a*. As the light diffusive fine particles 626, there are exemplified fine particles of silica, alumina, titania, calcium carbonate, aluminum hydroxide, an acrylic resin, an organic silicon resin, polystyrene, an urea resin, a formaldehyde condensate or the like, and one of these types is used or a plurality of types are mixed to be used. However, for the light diffusive fine particles 626 to exert sufficient light diffusibility, in the case where these fine particles are light transmissive, a refractive index thereof needs to differ sufficiently from a refractive index of the light transmissive resin. Accordingly, in the case where the light diffusive fine particles 626 are light transmissive, they are selected according to the light transmissive resin to be used in each case so as to satisfy the above-mentioned condition.

Such light diffusive fine particles 626 are dispersed in an appropriate solvent (for example, a solvent used for the light transmissive resin) in advance, thereby being adjusted into an ink capable of being discharged from the discharging head 20. At this time, it is preferable that surfaces of the light diffusive fine particles 626 are subjected to coating treatment by an interfacial active agent, or subjected to a treatment for coating with a fused resin to thereby improve the dispersibility of the light diffusive fine particles 626 into the solvent. And by carrying out these treatments, a fluidity improving the discharge from the discharging head 20 can be added to the light diffusive fine particles 626. As the interfacial active agent for the surface treatment, cationic based, anionic based, nonionic based, amphoteric, silicon based, and fluorocarbon resin based interfacial active agents are selected in each case according to the type of light diffusive fine particles 624 to be used.

Furthermore, as such light diffusive fine particles 626, ones having a particle diameter not less than 200 nm and not more than 500 nm are preferably used. This is because in such a range, setting the particle diameter to not less than 200 nm can ensure favorable light diffusibility and setting it to not more than 500 nm enables favorable discharge from the nozzle from the discharging head 20.

For the discharge of the droplet 622*b* having the light diffusive fine particles 626 dispersed, the same discharging head as the discharging head 20 discharging the droplet 622*a* of the light transmissive resin may be used, or a different one may be used. In the case where the same one is used, a device structure including the discharging head 20 can be simplified. On the other hand, in the case where the different one is used, a dedicated head can be used for each functional liquid (the functional liquid composed of the light transmissive resin and the functional liquid composed of the light diffusive fine particles 24), and thus, when switching the functional liquids to be applied, cleaning of the head or the like does not need to be carried out, thereby improving productivity.

Thereafter, a heating treatment, a depressurization treatment, or a heating and depressurization treatment is carried out to thereby vaporize the solvent of the droplet 622*b* having the light diffusive fine particles 624 dispersed. Then, the surface of the cured substance 623*a* is softened by the solvent of the droplet 622*b*, and the light diffusive fine particles 626 are attached to the surface, and thus when the solvent is vaporized to recure the surface of the cured substance 623*a*, the light diffusive fine particles 624 are fixed to the surface of the cured substance 623*a* of the light transmissive resin. By fixing the light diffusive fine particles 624 to the surface of the cured substance 623*a* in this way, there can be attained a microlens 625 of the present invention, which has the light diffusive fine particles 624 diffused in the surface part, as shown in FIG. 13(*d*).

Since the convex shape (in substantially semispherical shape) microlens 625 composed of the light transmissive resin 623 and the light diffusive fine particles 624 is formed using the ink jet method, unlike a case using a die molding method or an injection molding method, a molding die is not necessary, and the loss of materials can be minimized. Accordingly, a reduction in manufacturing cost can be attained. Furthermore, since the obtained microlens 625 is given a convex shape (substantially semispherical shape), this microlens can diffuse light almost uniformly over a wide angle range (direction) of 360°, for example, and in addition, by combining the light diffusive fine particles 626, a high diffusion performance can be imparted to the obtained microlens.

<DNA Chip>

Figure 14A:
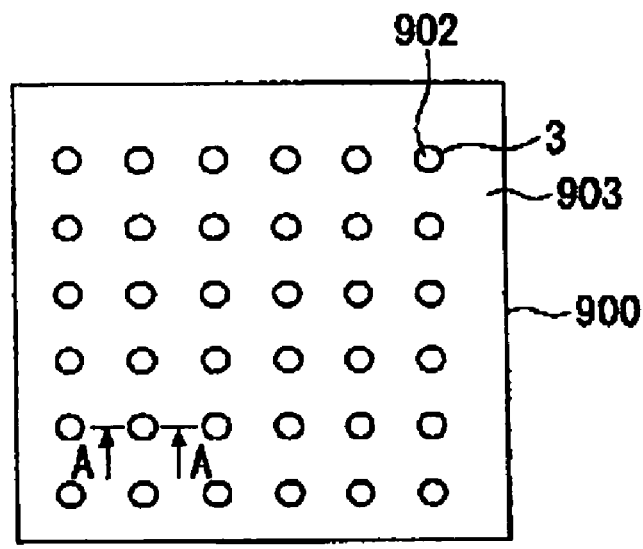
FIG. 14 is schematic view showing one embodiment of a gene chip formed using the thin film pattern according to the present invention.
Figure 14B:
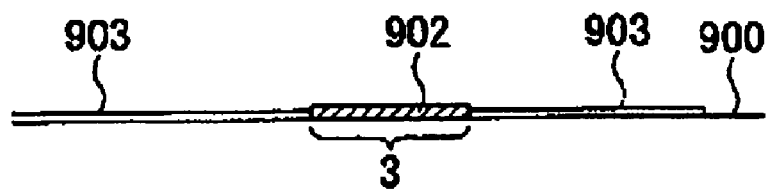
Figure 14C:
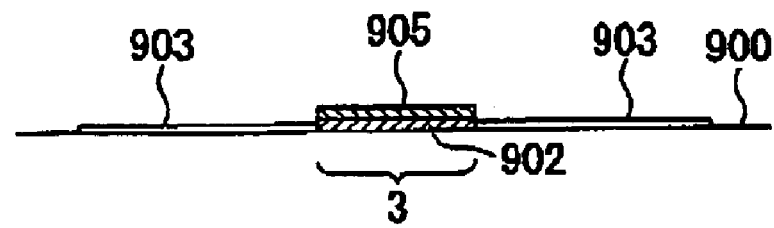

FIG. 14 is view for explaining an embodiment in which a DNA chip as an inspection machine is formed using the thin film pattern according to the present invention, FIG. 14(*a*) is a plan view, and FIGS. 14(*b*) and 14(*c*) are cross-sectional views taken along A—A. Techniques regarding a DNA chip are described in for example Japanese Unexamined Patent Publications No. H10-168386, No. 2000-232883 or the like.

In FIGS. 14(*a*) and 14(*b*), the DNA chip of the present example has a structure in which a reactive film 902 is provided on a base material 900. In the present embodiment, a thin film 903 having liquid repellent is provided around the reactive film 902. The thin film 903 is composed of a monomolecular film having liquid repellent. For a reactive agent forming the reactive film 902 for the DNA chip, for example, DNA fragments are used. DNA fragments of dozens or hundreds of types whose gene sequences have been identified are contained in a solution and fixed on the base material 900. Furthermore, as shown in FIG. 13(*c*), the DNA chip of the present example is designed such that light enters from the back side of the base material 900 and passes through the reactive film 902 to be taken out. When using the DNA chip of the present example, a liquid gene sample 905 is prepared and arranged on the chip. When a gene matching the sample is present, it reacts to the reactive film 902 by a trapping reaction and a base sequence is specified to thereby emit fluorescence by a synthesized fluorescent dye.

In order to manufacture the above-mentioned DNA chip, the thin film 903 is first formed on the base material 900, and then a thin film pattern having the removal region 3 is formed based on the thin film pattern forming method according to the present invention. Next, by the discharging head 20, the reactive agent is discharged to the removal region 3 from the discharging head 20 to form the reactive film 902 on the base material 900. Thereby, the DNA chip is manufactured.

It is also possible that the reactive film 902 is provided in advance on the entire surface on the base material 900 having a photothermal conversion layer, and that light is irradiated to this reactive film 902 to remove the reactive film 902 corresponding to an irradiation region to which the light is irradiated, thereby carrying out the patterning, so that the reactive film 902 is arranged discretely on the base material 900. Then, with respect to the reactive film 902 arranged discretely, the gene sample 905 may be arranged.

<Other Embodiments>

In the above-mentioned embodiments, instead of the sublimable dyestuff layer 5 (or sublimable dyestuff), a gas generating layer containing a gas generating material which generates a gas by irradiating the light may be provided. Thus, by providing the gas generating material on the base material 1 or in the base material 1, the gas can be generated from a desired region by the irradiated light, and the generation of the gas can remove the thin film 2 in the desired region from the base material 1 to pattern the thin film 2. Accordingly, the mask in the conventional patterning is not required, and without using an electron beam or ultraviolet rays, patterning of the thin film can be performed at a high resolution conveniently. That is, according to the present embodiment as well, a range of choice for a light irradiating device to be used is widened, and without using an expensive and large-scaled light irradiating device or mask, the thin film can be favorably removed from the base material to be pattern with high precision.

Furthermore, the above-mentioned gas generating layer may generate the gas not by irradiating the light, but by heating. The gas generating layer may be provided adjacently to the photothermal conversion layer 4, and the light may be irradiated to the photothermal conversion layer 4 to generate heat, which generates the gas from the gas generating layer to pattern the thin film 2. Accordingly, there can also be employed a structure in which between the base material 1 or the photothermal conversion layer 4 and the sublimable dyestuff layer 5 in the above-mentioned embodiments, the gas generating layer containing the gas generating material which generates the gas by the light irradiation or by heating is provided. With such a structure, only by light irradiation, only by heating, or by both the light irradiation and the heating, the gas can be generated to pattern the thin film 2.

The gas generating material, when absorbing the light or absorbing the thermal energy converted from the light energy, causes a decomposition reaction to emit nitrogen gas, hydrogen gas or the like, and it has a role to supply energy to remove the thin film 2 by the generated gas. As such a gas generating material, at least one substance selected from the group consisting of pentaerythritol tetranitrate (PETN), and trinitrotoluene (TNT), or the like, or GAP (glycidyl azide polymer) or the like is exemplified.

What is claimed is:

1. A method of pattern forming, comprising:
    providing a thin film on a base material containing a sublimable material; irradiating light to the base material; and
    sublimating the sublimable material in a desired region by heat generated by the light irradiation,
    so as to remove the thin film corresponding to an irradiation region where the light is irradiated to thereby patterning the thin film.

2. The pattern forming method according to claim 1, wherein the sublimable material contains a sublimable dyestuff.

3. A method of pattern forming, comprising:
    providing a thin film on a base material containing a gas generating material;
    irradiating light to the base material; and
    generating a gas from the gas generating material in a desired region by the light irradiation,
    so as to remove the thin film corresponding to an irradiation region where the light is irradiated to thereby patterning the thin film.

4. The pattern forming method according to claim 1, wherein the thin film includes an organic thin film.

5. The pattern forming method according to claim 1, wherein the thin film includes a monomolecular film.

6. The pattern forming method according to claim 1, wherein the thin film includes a monomer containing a photoinitiator.

7. The pattern forming method according to claim 1, wherein the sublimable material is formed as a sublimable dyestuff layer independent of the base material and the thin film on a front surface side or a back surface side of the base material.

8. The pattern forming method according to claim 7, wherein the sublimable dyestuff layer is provided on one surface side of the base material where the thin film is provided.

9. The pattern forming method according to claim 7, wherein the sublimable dyestuff layer is provided adjacently to the thin film.

10. The pattern forming method according to claim 7, wherein the sublimable dyestuff layer is provided between the base material and the thin film.

11. The pattern forming method according to claim 1, wherein the sublimable material is mixed in the base material.

12. The pattern forming method according to claim 1, wherein the base material contains a photothermal conversion material converting light energy into thermal energy.

13. The pattern forming method according to claim 7, wherein the photothermal conversion material is mixed in the sublimable dyestuff layer.

14. The pattern forming method according to claim 13, wherein the photothermal conversion layer containing the photothermal conversion material is provided independently of the base material, the thin film and the sublimable dyestuff layer.

15. The pattern forming method according to claim 14, wherein the photothermal conversion layer and the sublimable dyestuff layer are provided adjacently to each other.

16. The pattern forming method according to claim 14, wherein the photothermal conversion layer is provided on the one surface side of the base material where the thin film is provided.

17. The pattern forming method according to claim 14, wherein the photothermal conversion layer is provided between the base material and the thin film.

18. The pattern forming method according to claim 14, wherein the photothermal conversion layer is provided on another surface side of the base material where the thin film is not provided.

19. The pattern forming method according to claim 13, wherein the photothermal conversion material is mixed in the base material.

20. The pattern forming method according to claim 13, wherein the photothermal conversion layer is formed on at least one of the front surface and the back surface of the base material,
- the sublimable dyestuff layer is formed on an upper surface of the photothermal conversion layer,
- the thin film is formed on an upper surface of the sublimable dyestuff layer; and
- thereafter, the light is irradiated.

21. The pattern forming method according to claim 14, wherein between the base material or the photothermal conversion layer and the sublimable dyestuff layer, a gas generating layer containing the gas generating material that generates the gas by light irradiation or heating.

22. The pattern forming method according to claim 1, wherein the light is irradiated from the one surface side of the base material where the thin film is provided.

23. The pattern forming method according to claim 1, wherein the light is irradiated from the another surface side of the base material where the thin film is not provided.

24. The pattern forming method according to claim 22, wherein based on a light transmittance of at least one of the thin film, the sublimable dyestuff layer, the photothermal conversion layer and the base material, it is determined whether the light is irradiated from the one surface side or from the another surface side.

25. The pattern forming method according to claim 1, wherein the light has a wavelength according to at least one of the sublimable material and the photothermal conversion material.

26. A wiring pattern forming method, wherein a wiring pattern is formed on the base material having the thin film pattern formed by the forming method according to claim 1.

27. The wiring pattern forming method according to claim 26, wherein a droplet containing a wiring pattern forming material is arranged on the base material where the thin film pattern is formed.

28. An electro-optic device, comprising the wiring pattern formed by the forming method according to claim 26.

29. Electronic equipment comprising the electro-optic device according to claim 28.

* * * * *